United States Patent
Shin et al.

(10) Patent No.: US 8,643,084 B2
(45) Date of Patent: Feb. 4, 2014

(54) VERTICAL NON-VOLATILE MEMORY DEVICE

(75) Inventors: Seung-Mok Shin, Yongin-si (KR);
Kyung-Tae Jang, Seoul (KR);
Chang-Won Lee, Seongnam-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 207 days.

(21) Appl. No.: 13/181,622

(22) Filed: Jul. 13, 2011

(65) Prior Publication Data

US 2012/0012920 A1   Jan. 19, 2012

(51) Int. Cl.
*H01L 29/792* (2006.01)

(52) U.S. Cl.
USPC ............. 257/326; 257/317; 257/324; 257/758

(58) Field of Classification Search
USPC .......... 257/324, 315, 758, 760, 326; 438/129, 438/268, 618, 619, 622, 624
See application file for complete search history.

(56) References Cited

U.S. PATENT DOCUMENTS

| | | | |
|---|---|---|---|
| 2008/0128757 A1* | 6/2008 | Chae et al. | 257/204 |
| 2009/0242966 A1* | 10/2009 | Son et al. | 257/324 |
| 2009/0242967 A1* | 10/2009 | Katsumata et al. | 257/324 |

FOREIGN PATENT DOCUMENTS

| | | |
|---|---|---|
| JP | 2009-094214 A | 4/2009 |
| JP | 2009-111049 A | 5/2009 |
| JP | 2009-224465 A | 10/2009 |
| JP | 2009-224466 A | 10/2009 |

* cited by examiner

*Primary Examiner* — Walter H Swanson
*Assistant Examiner* — Wilner Jean Baptiste
(74) *Attorney, Agent, or Firm* — Lee & Morse, P.C.

(57) ABSTRACT

A vertical non-volatile memory device includes a semiconductor pattern disposed on a substrate; and a plurality of transistors of first through n-th layers that are stacked on a side of the semiconductor pattern at predetermined distances from each other, wherein the transistors are spaced apart and insulated from one another at the predetermined distances via air gap, where n is a natural number equal to or greater than 2.

15 Claims, 18 Drawing Sheets

VERTICAL NON-VOLATILE MEMORY DEVICE

CROSS-REFERENCE TO RELATED APPLICATIONS

This application claims the benefit of Korean Patent Application No. 10-2010-0068585, filed on Jul. 15, 2010, in the Korean Intellectual Property Office, the disclosure of which is incorporated herein in its entirety by reference.

BACKGROUND

1. Field

Aspects described herein relate to a semiconductor device and a method of manufacturing the semiconductor device, and more particularly, to a non-volatile memory device in which cells are connected in a vertical direction, and a method of manufacturing the non-volatile memory device.

2. Description of the Related Art

In general, semiconductor memory devices are classified as volatile semiconductor memory devices, such as dynamic random access memory (DRAM) devices and static random access memory (SRAM) devices, and non-volatile semiconductor memory devices, such as flash memory devices. As the application of the semiconductor memory devices is extended, the semiconductor memory devices have been significantly improved in terms of the integration degree, operational speed, and electrostatic capacitance.

Among the non-volatile memory devices, the flash memory devices may be classified in terms of circuitry as NAND type flash memory devices in which N cell transistors are serially connected to form a unit string, and a plurality of unit strings are connected in parallel between a bit line and a ground line, and as NOR type flash memory devices in which cell transistors are connected in parallel between a bit line and a ground line.

SUMMARY

According to an embodiment, there is provided a vertical non-volatile memory device including a semiconductor pattern on a substrate, and a plurality of transistors of first through n-th layers that are stacked on a side of the semiconductor pattern at predetermined distances in multiple layers, wherein the transistors are spaced apart and insulated from one another at the predetermined distances via air gaps, where n is a natural number equal to or greater than 2.

The transistors may include a plurality of tunnel oxide layers, a portion of each tunnel oxide layer contacting a sidewall of the semiconductor pattern, wherein contacting portions are spaced apart at the predetermined distances in a vertical direction, a plurality of charge storage layers and a plurality of blocking dielectric layers that are sequentially formed on surfaces of the tunnel oxide layers, wherein at least a portion of each charge storage layer and blocking dielectric layer faces the semiconductor pattern, and a plurality of control gate patterns on surfaces of the blocking dielectric layers and vertically stacked on a surface of the substrate, wherein the control gate patterns face the semiconductor pattern and are spaced apart from one another at the predetermined distances.

The air gaps may be interposed between the transistors of each of the layers.

Among the air gaps, an air gap may have a width that is smaller at a location relatively far from the semiconductor pattern than at a location near the semiconductor pattern.

The width of the air gap at a location relatively far from the semiconductor pattern may be smaller than 30 nm.

Portions of the semiconductor pattern may be directly exposed by the air gaps.

The vertical non-volatile memory device may further include a residual insulation layer pattern interposed between the air gaps and the semiconductor pattern.

The air gaps may be closed spaces.

The semiconductor pattern may be a pillar-shaped semiconductor pattern.

According to another embodiment, there is provided a vertical non-volatile memory device including a linear insulation layer pattern on a substrate, the linear insulation layer pattern having two sidewalls, a plurality of semiconductor patterns contacting the two sidewalls of the insulation layer pattern and formed on a surface of the substrate, a plurality of tunnel oxide layers, at least a portion of each tunnel oxide layer contacting a corresponding semiconductor pattern at one of the sidewalls to form contacting portions, wherein the contacting portions are spaced apart at predetermined distances in a vertical direction, a plurality of charge storage layers and a plurality of blocking dielectric layers that are sequentially formed on surfaces of the tunnel oxide layers, wherein at least a portion of the charge storage layers and a portion of the blocking dielectric layers face the semiconductor pattern; and a plurality of control gate patterns on surfaces of the blocking dielectric layers, each control gate pattern facing the semiconductor pattern, the control gate patterns being vertically stacked at the predetermined distances in multiple layers, wherein the control gate patterns are spaced apart from one another by air gaps.

The air gaps may be interposed between adjacent ones of the control gate patterns and spaced apart at the predetermined distances from one another in multiple layers.

The semiconductor patterns may be pillar-shaped.

Each of the air gaps may have a width that is smaller at a location relatively far from the semiconductor pattern than at a location near the semiconductor pattern.

Portions of the semiconductor patterns may be directly exposed by the air gaps.

The vertical non-volatile memory device may further include a residual insulation layer pattern interposed between the air gaps and the semiconductor pattern.

According to another embodiment, there is provided a vertical non-volatile memory device including a plurality of vertical non-volatile memory device units, each unit including a linear insulation layer pattern disposed on a substrate, the linear insulation layer pattern having two sidewalls, a plurality of semiconductor patterns contacting the two sidewalls of the insulation layer pattern and contacting a surface of the substrate, a plurality of tunnel oxide layers, at least a portion of each tunnel oxide layer contacting the semiconductor patterns at one of the sidewalls to form contacting portions, wherein the contacting portions are spaced apart at predetermined distances in a vertical direction, a plurality of charge storage layers and a plurality of blocking dielectric layers sequentially formed on surfaces of the tunnel oxide layers, wherein at least a portion of the charge storage layers and a portion of the blocking dielectric layers face the semiconductor pattern, and a plurality of control gate patterns that are formed on surfaces of the blocking dielectric layers, each control gate pattern facing the semiconductor pattern at one of the side walls, the control gate patterns being vertically stacked at the predetermined distances in multiple layers, wherein the control gate patterns are spaced apart from one another by air gaps, and an insulation filler layer disposed between adjacent ones of the plurality of vertical non-volatile memory devices. The adjacent ones of vertical non-volatile memory devices are disposed such that control gate patterns at respective sides of the adjacent vertical non-volatile memory device face each other. The insulation filler layer contacts the control gate patterns and seals the air gaps.

Each air gap may have a width that is smaller at a location relatively nearer to the insulation filler layer than at a location relatively nearer to the semiconductor pattern.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
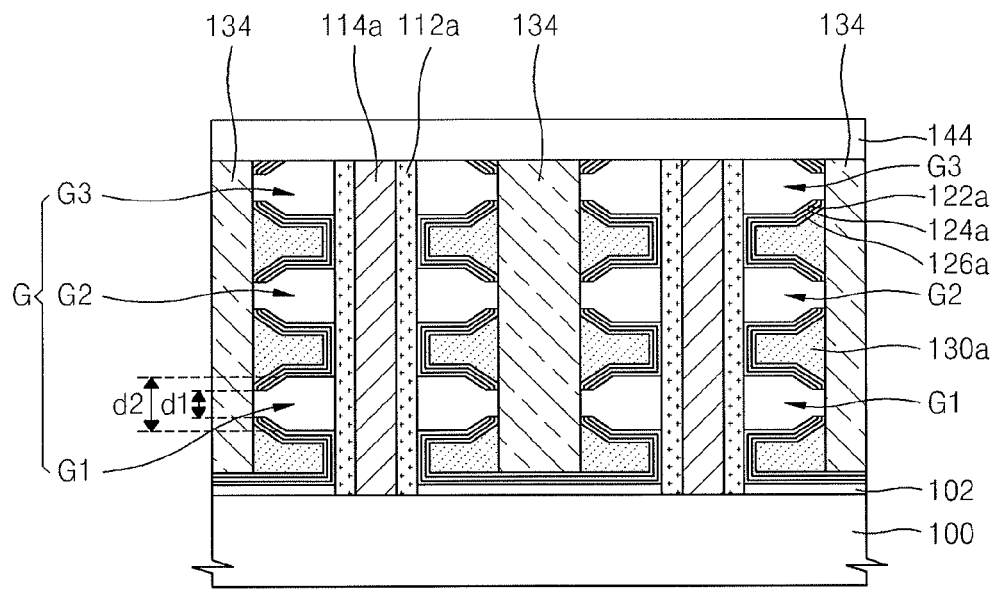
FIG. 1 illustrates a cross-sectional view of a non-volatile memory device according to an embodiment.

Korean Patent Application No. 10-2010-0068585, filed on Jul. 15, 2010, in the Korean Intellectual Property Office, and entitled: "Vertical Non-Volatile Memory Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when a component such as a layer, a region, or a substrate is referred to as being "on", "connected to", or "coupled to" another component throughout the specification, it can be directly "on", "connected to", or "coupled to" the other component, or intervening layers may also be present. On the other hand, when a component is referred to as being "directly on", "directly connected to", or "directly coupled to" another component, it will be understood that no intervening layer is present. As used in the present specification, the term "and/or" includes one of listed, corresponding items or combinations of at least one item.

In the present description, terms such as 'first', 'second', etc. are used to describe various members, components, regions, layers, and/or portions. However, it is obvious that the members, components, regions, layers, and/or portions should not be defined by these terms. The terms are used only for distinguishing one member, component, region, layer, or portion from another member, component, region, layer, or portion. Thus, a first member, component, region, layer, or portion which will be described may also refer to a second member, component, region, layer, or portion, without departing from the teaching of the inventive concept.

Relative terms, such as "lower" or "bottom," "upper" or "top" or "vertical," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "upper" side of other elements would then be oriented on "lower" sides of the other elements. The exemplary term "upper", can therefore, encompass both an orientation of "lower" and "upper", depending of the particular orientation of the figure. If the device is oriented in another direction, that is, rotated by 90° with respect to the direction, the description on the relative teams of the present specification can be understood accordingly.

Figure 2:
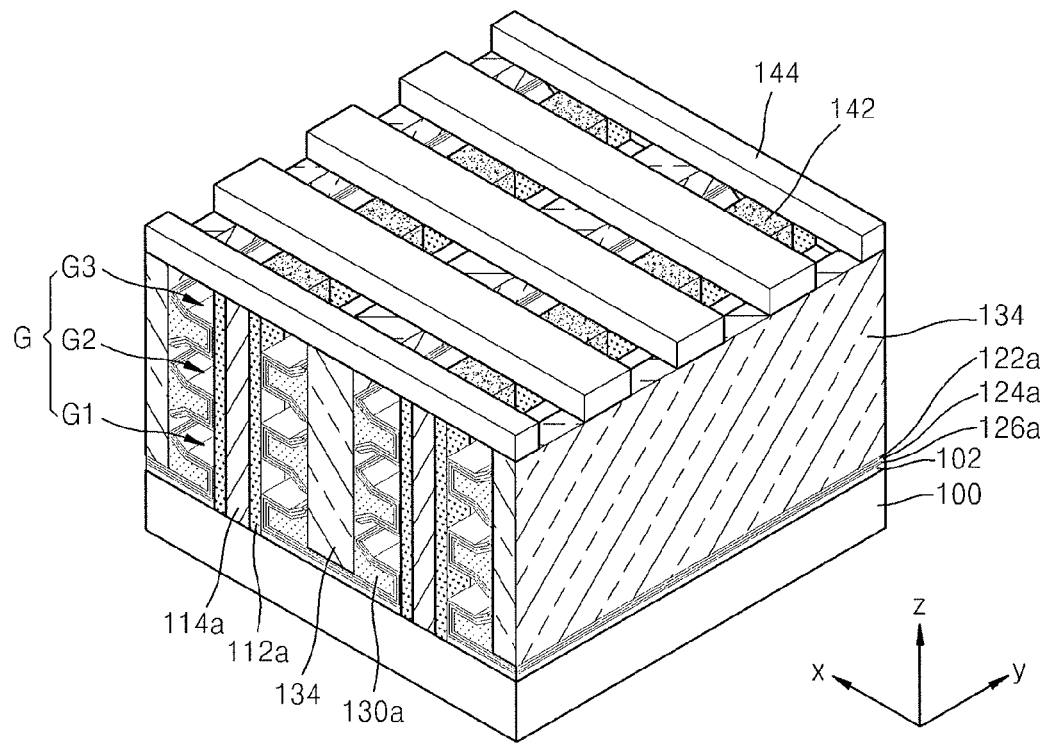
FIG. 2 illustrates a perspective view of the non-volatile memory device illustrated in FIG. 1.

FIG. 1 is a cross-sectional view illustrating a non-volatile memory device according to an embodiment. FIG. 2 is a perspective view illustrating the non-volatile memory device illustrated in FIG. 1.

Referring to FIGS. 1 and 2, a substrate 100 made of a single crystal semiconductor material may be formed. The substrate 100 may be formed of, for example, single crystal silicon. An impurity region (not shown) may be formed as a common source line below a surface of the substrate 100. The impurity region may be formed on a portion of the substrate 100 where one cell block is formed. The impurity region may be formed of n-type impurities. As the impurity region is formed, lower portions of cell strings formed in single crystal semiconductor patterns 112a may be connected to one another.

A linear insulation layer pattern extending in a first direction is formed on the substrate 100. The first direction may be, for example, a y direction as indicated in FIG. 2. The insulation layer pattern 114a may be at the same height as the single crystal semiconductor pattern 112a. The insulation layer pattern 114a may be formed of, for example, a silicon oxide.

On two sidewalls of the insulation layer pattern 114a, pillar-shaped single crystal semiconductor patterns 112a are formed. A plurality of single crystal semiconductor patterns 112a may be regularly and repeatedly arranged on the two sidewalls of one insulation layer pattern 114a. The single crystal semiconductor patterns 112a have a sidewall that is vertically or almost vertically arranged. The single crystal semiconductor patterns 112a may have a rectangular parallelepiped shape.

A sum of a line width of the insulation layer pattern 114a and line widths of the two single crystal semiconductor patterns 112a formed on the two sides of the insulation layer pattern 114a may be reduced up to a minimum line width of a pattern that may be formed by using a photolithography process.

The single crystal semiconductor patterns 112a may be formed of single crystal silicon. The single crystal silicon may be formed by a phase transition of amorphous silicon in a thermal process using a furnace or through a laser epitaxial growth process. Alternatively, the single crystal silicon may be formed by using a selective epitaxial growth process that uses the substrate 100 as a seed.

Cell transistors are included on a sidewall of the single crystal semiconductor pattern 112a opposite to a sidewall thereof that contacts the insulation layer pattern 114a. Hereinafter, the sidewall of the single crystal semiconductor pattern 112a contacting the insulation layer pattern 114a will be referred to as a "first sidewall", and the sidewall of the single crystal semiconductor pattern 112a that is opposite to the first sidewall and on which cell transistors are formed will be referred to as a "second sidewall."

The cell transistors formed in each of the pillar-shaped single crystal semiconductor patterns 112a form one cell string. That is, the cell transistors are serially connected in a vertical direction on a surface of the substrate 100 along the single crystal semiconductor patterns 112a. In general, $2^m$ cell transistors (m is a natural number equal to or greater than 1) may be formed within one cell string formed on the substrate 100. However, increasing the number of cell transistors included in a cell string increases the difficulty in manufacturing the non-volatile memory device, since the cell transistors are stacked in a vertical direction. Thus, to provide ease in manufacturing, two, four, or eight cell transistors may be serially connected in one cell string. However, the number of cell transistors of the current embodiment is exemplary and the scope thereof is not limited to the illustrated number of cell transistors.

Interlayer insulation air gap patterns G that contact the second sidewall of the single crystal semiconductor patterns 112a may be formed. The interlayer insulation air gap patterns G may be empty spaces filled with air. Also, the interlayer insulation air gap patterns G may be closed spaces rather than open spaces. For example, the interlayer insulation air gap patterns G may be spaces that are each defined by the single crystal semiconductor pattern 112a, a tunnel oxide layer pattern 122a, and an insulation filler layer pattern 134, as described in more detail below.

The interlayer insulation air gap patterns G are spaced apart from each other at predetermined distances, and may have, for example, a line shape extending in the first direction. The interlayer insulation air gap patterns G may be formed to simultaneously contact the plurality of single crystal semiconductor patterns 112a arranged in the first direction.

Figure 14:
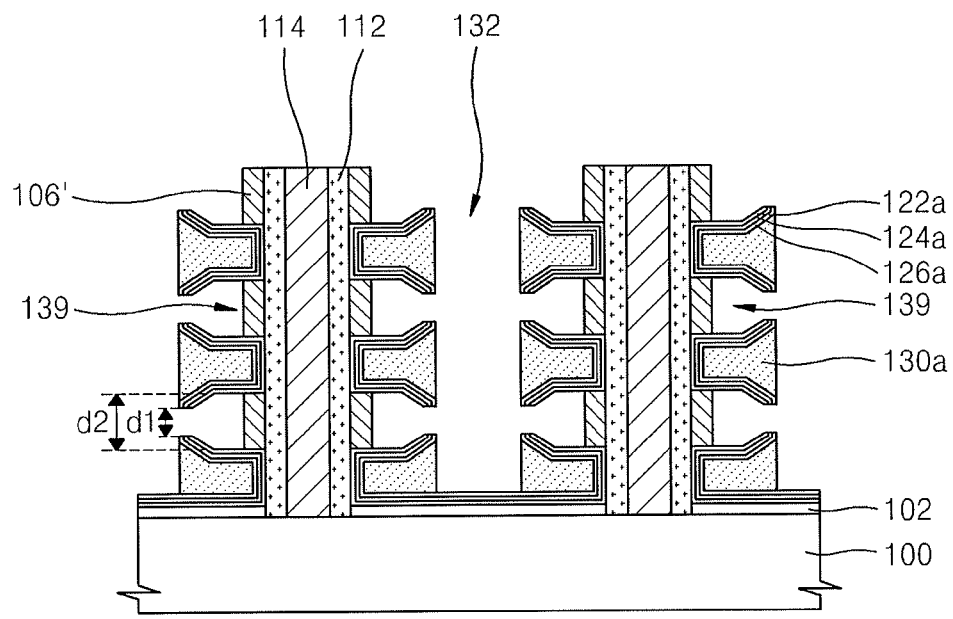

According to another example of the embodiment, a residual insulation layer pattern, such as, for example, a residual interlayer insulation layer pattern 106' of FIG. 14, may be formed on the semiconductor patterns 112a. Along one single crystal semiconductor pattern 112a, a plurality of interlayer insulation air gap patterns G including the residual interlayer insulation layer may be spaced apart from each other and disposed in multiple tiers.

The cell transistors are formed between the interlayer insulation air gap patterns G, respectively. Thus, the interlayer insulation air gap patterns G have the function of defining a region for forming cell transistors. Also, the interlayer insulation air gap patterns G insulate control gate patterns 130a of different tiers.

When the interlayer insulation air gap patterns G are formed between the control gate patterns 130a instead of interlayer insulation layer patterns (that is, layer patterns including an interlayer insulating material), the vertical non-volatile memory device may not be affected by impurities that may be present if an interlayer insulation layer pattern were used. In detail, when the air gaps are used, the vertical non-volatile memory device are not affected by hydrogen atoms that may be present if interlayer insulation layer patterns were used. Thus, improvement of the performance of a semiconductor device may be facilitated.

In addition, by replacing the interlayer insulation layer patterns with the interlayer insulation air gap patterns G, the height of the vertical non-volatile memory device may be reduced, thereby avoiding having to perform a deep etching operation during an etching process.

Hereinafter, the interlayer insulation air gap patterns G will be described in more detail.

A first layer cell gate electrode, a second layer cell gate electrode, and a third cell gate electrode are sequentially and separately formed on the substrate 100. A first interlayer insulation air gap pattern G1 is interposed between the first layer cell gate electrode and the second layer cell gate electrode. A second interlayer insulation air gap pattern G2 is interposed between the second layer cell gate electrode and the third layer cell gate electrode. A third interlayer insulation air gap pattern G3 is formed on the third layer cell gate electrode. Although not shown in the drawing, the third interlayer insulation air gap pattern G3 may be interposed between the third layer cell gate electrode and a fourth cell gate electrode.

Each of the first through third interlayer insulation air gap patterns G1, G2, and G2, hereinafter referred to as "the interlayer insulation air gap patterns G", may have a width that decreases in a direction away from the single crystal semiconductor patterns 112a which the interlayer insulation air gap patterns G respectively contact. For example, a width d1 at a location of an interlayer insulation air gap pattern G relatively far from the adjacent single crystal semiconductor pattern 112a may be smaller than a width d2 at a location of the interlayer insulation air gap pattern G adjacent to the single crystal semiconductor pattern 112a. For example, the width d1 at the location of the interlayer insulation air gap pattern G disposed relatively far from the single crystal semiconductor pattern 112a may be smaller than 30 nm. When the width d1 of the interlayer insulation air gap pattern G disposed at a location farther from the single crystal semiconductor pattern 112a is small, it is possible to prevent an insulation filler layer pattern 134, described below, from filling in the interlayer insulation air gaps G when the insulation filler layer pattern 134 is formed, and thus the interlayer insulation air gap patterns G may be formed as closed spaces.

As described above, cell transistors are formed on the second sidewall of the single crystal semiconductor patterns 112a contacting the interlayer insulation air gap patterns G. Hereinafter, the cell transistors formed on the single crystal semiconductor pattern 112a will be described in detail.

A tunnel oxide layer pattern 122a is foamed on a second sidewall of the single crystal semiconductor pattern 112a. At least a portion of the tunnel oxide layer pattern 122a contacts the sidewall of the single crystal semiconductor pattern 112a, and contacting portions thereof may be vertically spaced apart from one another at predetermined distances. That is, the tunnel oxide layer pattern 122a may be in discontinuous contact with a sidewall of the single crystal semiconductor pattern 112a.

The tunnel oxide layer pattern 122a may be formed of a thermal oxide layer that is formed by thermally oxidizing a surface of the single crystal semiconductor pattern 112a. The tunnel oxide layer pattern 122a may be formed of a silicon oxide that is formed using a thermal oxidization process. If the tunnel oxide layer pattern 122a is formed by thermally oxidizing a portion of the single crystal semiconductor pattern 112a, the durability of the tunnel oxide layer pattern 122a is better than that of a tunnel oxide layer pattern 122a formed using a chemical vapor deposition (CVD) method. Accordingly, the non-volatile memory device according to the current embodiment of the inventive concept may have excellent reliability.

However, according to another embodiment, the tunnel oxide layer pattern 122a may be formed of an oxide formed using a CVD method.

A charge storage layer pattern 124a is formed on the tunnel oxide layer pattern 122a. The charge storage layer pattern 124a may include a silicon nitride or a metal oxide. A blocking dielectric layer pattern 126a is formed on the charge storage layer pattern 124a. The blocking dielectric layer pattern 126a may include a silicon oxide or a metal oxide.

A plurality of control gate patterns 130a is used as word lines. Control gate patterns 130a arranged in different layers are insulated from one another via the interlayer insulation air gap patterns G.

An insulation filler layer pattern 134 is formed to contact the interlayer insulation air gap patterns G and the control gate patterns 130a. The insulation filler layer pattern 134 may be formed of a silicon oxide layer pattern. Accordingly, the insulation filler layer pattern 134 is disposed to face the insulation layer pattern 114a.

In other words, the insulation filler layer pattern 134 may be in the form of a line or wall extending in the first direction, and may be arranged parallel to the insulation layer pattern 114a. The control gate patterns 130a formed at each sidewall of the adjacent single crystal semiconductor patterns 112a are insulated via the insulation filler layer pattern 134.

Although not illustrated in FIG. 1, according to another embodiment, the insulation filler layer pattern 134 may be replaced by a circuit pattern formed of a first conductive material layer pattern in a center and a first insulation layer pattern surrounding the first conductive material pattern. In this case, the first insulation layer pattern directly contacts the control gate pattern 130a, and the control gate patterns 130a may be insulated from the first conductive material layer pattern via the first insulation layer pattern 134. The first conductive material layer pattern may be electrically connected to the substrate 100.

A bit line 144 electrically connecting upper surfaces of the single crystal semiconductor patterns 112a is foamed. As illustrated in FIG. 1, the bit line 144 is directly connected to the upper surfaces of the single crystal semiconductor patterns 112a and thus a bit line contact plug may not be necessary.

According to another embodiment, bit line contact plugs contacting the upper surfaces of the single crystal semiconductor pattern 112a may be included. In this case, an upper interlayer insulation layer may be formed on upper surfaces of the single crystal semiconductor patterns 112a, the insulation layer patterns 114a, the interlayer insulation air gap patterns G, and the insulation filler layer patterns 134, and the bit line contact plugs may be included in the upper interlayer insulation layer. Also, the bit line may be formed on the upper interlayer insulation layer.

Although not illustrated in FIG. 1, according to an embodiment, upper and lower selection transistors including a gate insulation layer pattern and a gate electrode may be formed on the uppermost and lowermost sidewalls of the single crystal semiconductor pattern 112a. That is, the upper selection transistor may be formed between the bit line 144 and an uppermost cell transistor, and the lower selection transistor may be formed between the substrate 100 and a lowermost cell transistor.

The upper selection transistor and the lower selection transistor may have the same form as the cell transistor. That is, the gate insulation layer of the upper and lower selection transistors may have a structure in which, for example, a silicon oxide pattern having the same composition as the tunnel oxide layer 122a, a silicon nitride pattern having the same composition as the charge storage layer 124a, and a silicon oxide pattern having the same composition as the blocking dielectric layer 126a are stacked. Also, the gate electrode of the upper and lower selection transistors may have the same form as the control gate pattern 130a.

The single crystal semiconductor pattern 112a may be entirely doped with n-type impurities. In this case, the cell transistor and the selection transistor are in an on-state in the atmosphere, and may be converted to an off-state by a voltage applied to the gate electrode.

Alternatively, source/drain regions (not shown) doped with n-type impurities may be formed under a surface of the sidewalls of the single crystal semiconductor patterns 112a contacting the interlayer insulation air gap patterns G in each of the single crystal semiconductor patterns 112a.

In addition, channel doping regions doped with p-type impurities, which are opposite to the conductive type of the above-described source/drain regions, may be formed under a surface of the sidewalls of the single crystal semiconductor patterns 112a contacting the tunnel oxide layer patterns 122a.

In the above-described non-volatile memory device, one cell string is disposed in a pillar-shaped single crystal semiconductor pattern. Also, two single crystal semiconductor patterns are formed within a very narrow surface area in which one trench may be formed. Two single crystal semiconductor patterns may be formed within critical dimensions of the trench. Accordingly, the number of cell strings that can be formed per unit surface area may be increased, thereby increasing the integration degree of the device.

In addition, the sidewalls of the single crystal semiconductor patterns may be perpendicular or inclined almost perpendicularly. Accordingly, the integration degree of the device may be further increased. Also, Cell transistors may be provided in a single crystal semiconductor pattern having almost no crystal defects. Accordingly, cell current and cell distribution characteristics of the cell transistors may be excellent.

In addition, the tunnel oxide layer formed in each of the cell transistors that are vertically stacked may be formed of a thermal oxide layer. Thus, the durability of the cell transistors may be excellent.

FIGS. 3 through 19 are cross-sectional views illustrating a method of manufacturing a vertical non-volatile memory device according to the embodiment FIGS. 1 and 2. FIG. 20 is an expanded cross-sectional view of a portion Z of FIG. 10. FIGS. 21 through 31 are perspective views illustrating a method of manufacturing a vertical non-volatile memory device of FIG. 1 according to the embodiment of FIGS. 1 and 2.

Figure 3:
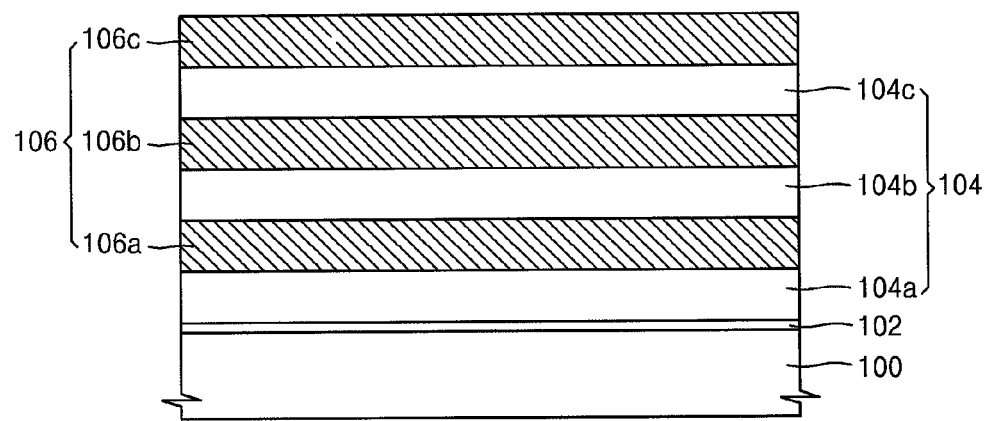
FIGS. 3 through 19 illustrate cross-sectional views of a method of manufacturing the vertical non-volatile memory device illustrated in FIG. 1.

Referring to FIG. 3, a substrate 100 formed of a single crystal silicon is provided. A portion of the substrate 100 may be doped with n-type impurities to form an impurity region (not shown) that is used as a source line of a NAND flash memory device. The impurity region may be formed by doping a portion of the substrate 100 where a cell block is to be formed with n-type impurities.

On the substrate 100 doped with impurities, a pad oxide layer 102 may be formed. The pad oxide layer 102 may be formed by thermally oxidizing the substrate 100 or depositing an oxide layer using a CVD method. The pad oxide layer 102 may be provided to prevent or reduce stress generated when layers formed of silicon nitride directly contact the substrate 100.

A plurality of sacrificial layers 104 and a plurality of interlayer insulation layers 106 are repeatedly stacked on the pad oxide layer 102. The interlayer insulation layers 106 and the sacrificial layers 104 may be formed using a CVD method.

The sacrificial layers 104 may be formed of a material having etching selectivity with respect to the interlayer insulation layers 106 and single crystal silicon. Also, the sacrificial layers 104 may be formed of a material that can be easily removed using a wet etching process. According to the current embodiment, the sacrificial layers 104 may be formed of a silicon nitride, and the interlayer insulation layers 106 may be formed of a silicon oxide. However, the materials are not limited by the described materials, which are examples for description of the embodiments. Hereinafter, sacrificial layers 104 formed of a silicon nitride layer, and interlayer insulation layers 106 formed of a silicon oxide layer will be described.

Also, according to the current embodiment, a sacrificial layer 104 may be formed in a lowermost portion of the structure including a plurality of repeatedly stacked layers, and an interlayer insulation layer 106 is formed in an uppermost portion thereof. However, the sequence or structure of the stack may be modified, and the sequence and structure of the stack illustrated in the drawings are just exemplary for the purpose of description.

The sacrificial layers 104 are removed in a subsequent process to define a portion where a control gate pattern of each layer is to be formed. Thus, the sacrificial layers 104 may have a thickness equal to or greater than an effective length of the control gate pattern of each layer.

A control gate pattern is formed in a portion where the sacrificial layers 104 are removed. Accordingly, the number of the sacrificial layers 104 and the interlayer insulation layers 106 being stacked may be the same as or greater than the number of cell transistors that are to be included in the cell string.

Also, although not illustrated in the drawings, when selection transistors are formed on two end portions of the cell transistors arranged in a direction perpendicular to a surface of the substrate 100, that is, in an extension direction of a single crystal semiconductor pattern, a sacrificial layer and an interlayer insulation layer may be further stacked in order to define a region in which the selection transistors are to be formed.

Figure 4:
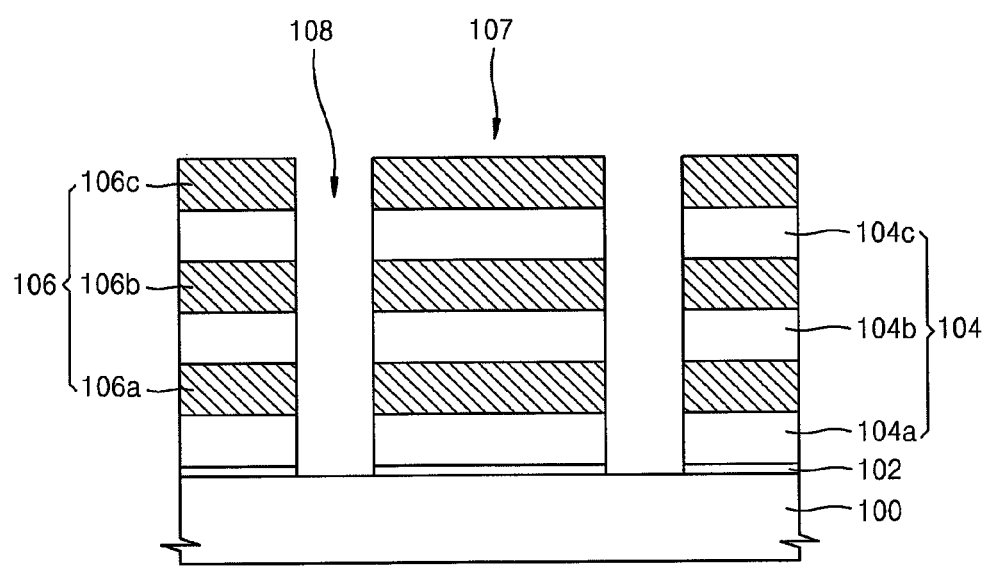
Figure 21:
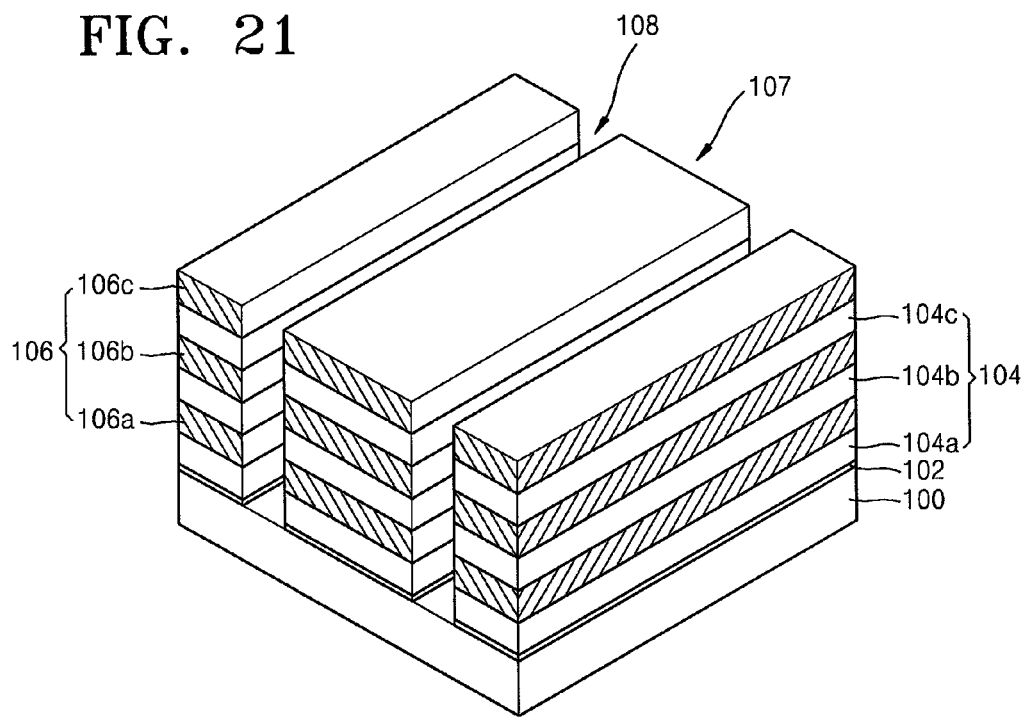
FIGS. 21 through 31 illustrate perspective views of a method of manufacturing the vertical non-volatile memory device illustrated in FIG. 1.

Referring to FIGS. 4 and 21, a first photoresist pattern (not shown) may be formed on an interlayer insulation layer 106c disposed in the uppermost portion. The first photoresist pattern may be in the form of a line extending in a first direction.

The sacrificial layers 104 and the interlayer insulation layers 106 are sequentially etched using the first photoresist pattern as an etching mask to form an insulation layer structure 107 including a first trench 108 extending in the first direction.

That is, an insulation layer structure 107 may be in the form of a line extending in the first direction. A surface of the single crystal silicon substrate 100 may be exposed via the first trenches 108.

In order to manufacture a highly integrated semiconductor device, the first trench 108 may be formed to have as small a width as possible by using a photolithography process. In a subsequent operation, a pillar-shaped single crystal silicon pattern is formed on two sidewalls of the trench 108.

Figure 5:
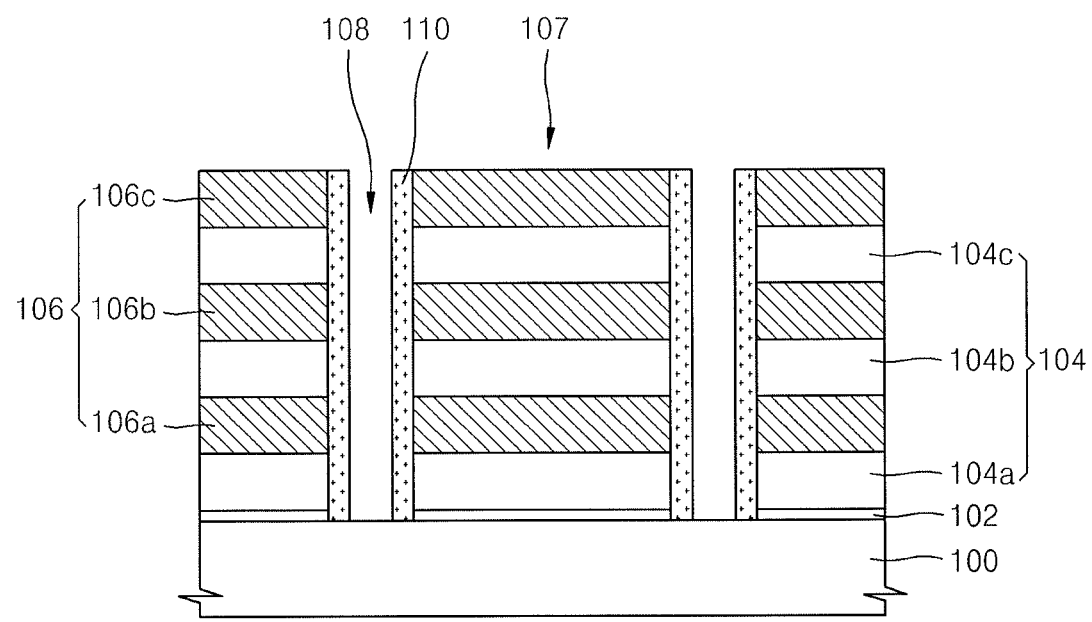
Figure 22:
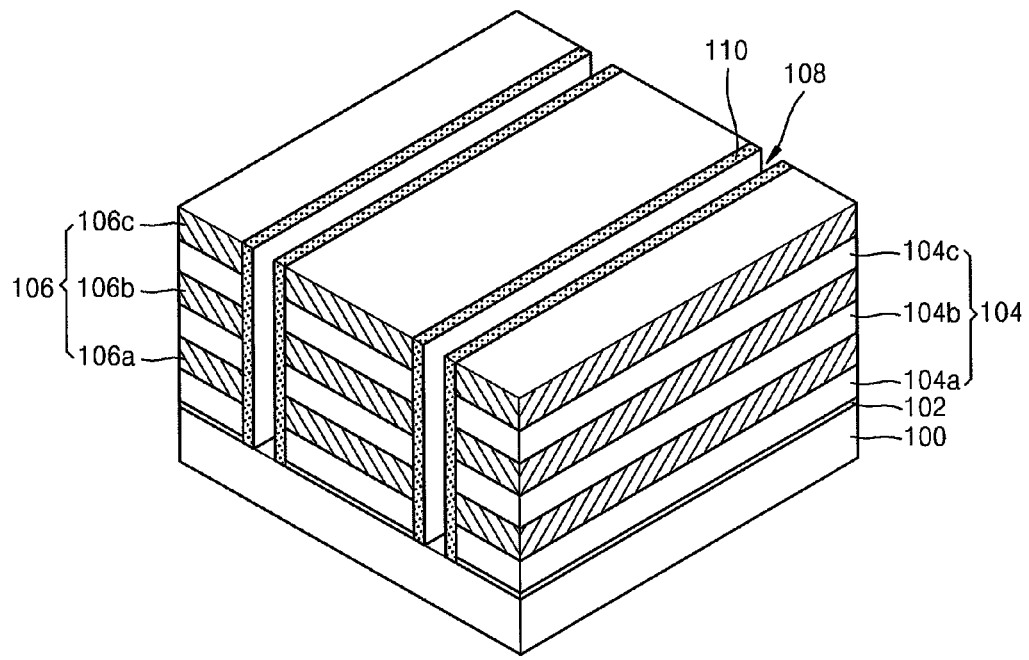

Referring to FIGS. 5 and 22, an amorphous silicon layer (not shown) may be formed on the sidewalls of the first trenches 108, the surface of the substrate 100, and an upper surface of the insulation layer structure 107. The amorphous silicon layer may be formed using a CVD method. When performing the CVD method, an in-situ doping operation may be performed so as to form an amorphous silicon layer doped with n-type impurities. According to another example, a polysilicon layer instead of the amorphous silicon layer may be formed.

Next, the amorphous silicon layer may be anisotropically etched such that the amorphous silicon layer remains only on the two sidewalls of the first trench 108, thereby forming a spacer-shaped amorphous silicon pattern 110.

According to another example of the current embodiment, the amorphous silicon layer formed on the upper surface of the insulation layer structure 107 may be anisotropically etched to form a spacer-shaped amorphous silicon pattern (not shown) formed on the two sidewalls of the first trench 108 and the surface of the substrate 100 exposed by the first trench 108. In this case, the amorphous silicon pattern formed on the two sidewalls of the first trench 108 may be connected to each other via the amorphous silicon pattern formed on the surface of the substrate 100.

Figure 6:
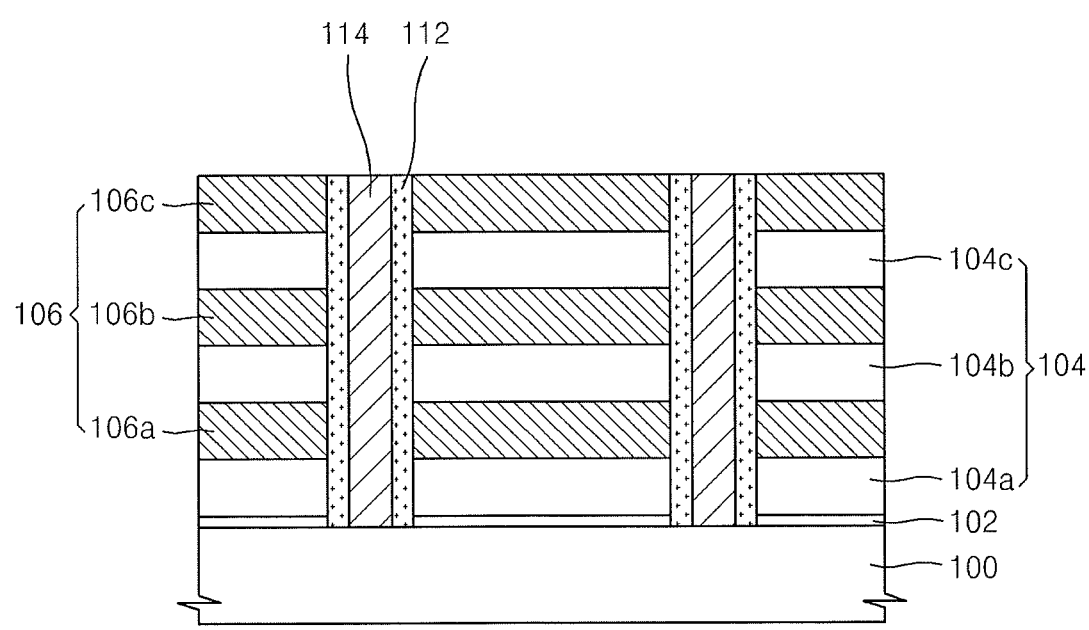
Figure 23:
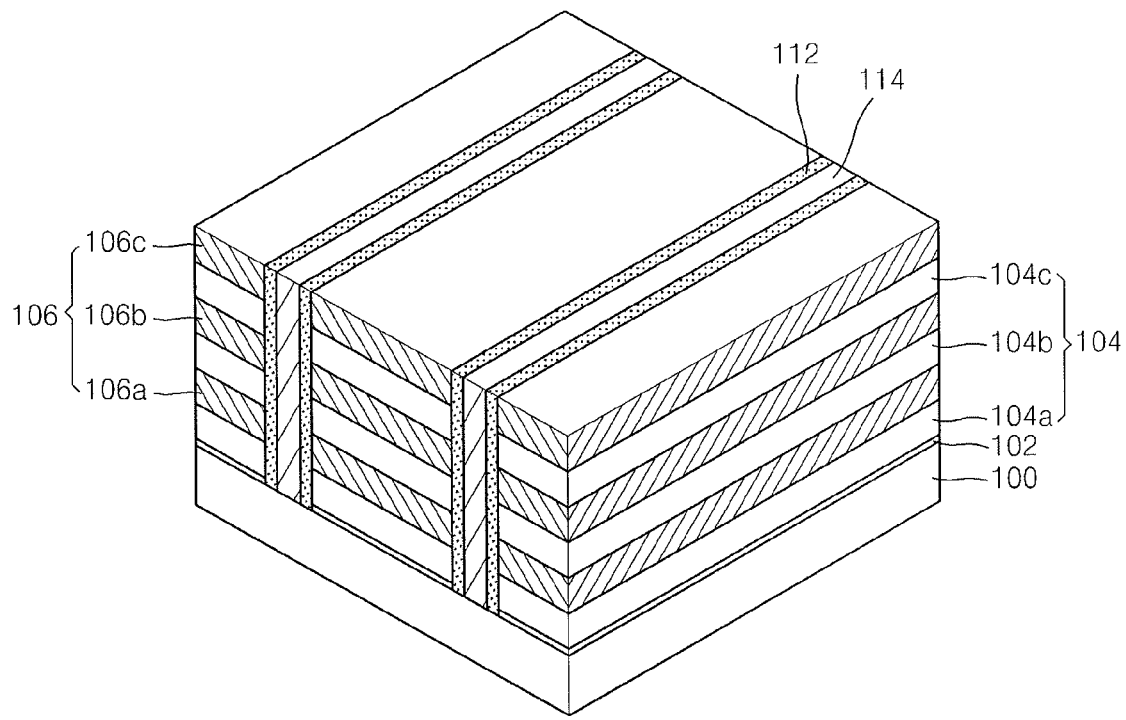

Referring to FIGS. 6 and 23, a silicon oxide layer (not shown) may be formed to fill the first trench 108 on which the amorphous silicon pattern 110 is formed. Next, a portion of the silicon oxide layer may be polished such that an upper surface of the amorphous silicon pattern 110 is exposed to form a silicon oxide layer pattern 114. The silicon oxide layer pattern 114 functions as an insulation layer pattern, Next, the amorphous silicon pattern 110 may be thermally treated such that the amorphous silicon pattern 110 phase changes to a preliminary single crystal silicon pattern 112. The preliminary single crystal silicon pattern 112 may be formed by using a laser epitaxy growth process (LEG), a solid phase change epitaxy (SPE) process or a metal induced crystallization process. The thermal treatment may be performed using a laser or using a furnace. When a furnace is used, amorphous silicon may be thermally treated at a temperature of about 600 to 700° C. for several hours to phase change the amorphous silicon to single crystal silicon.

The laser used for a thermal treatment in the LEG process may have an energy density high enough to completely melt the amorphous silicon pattern 110. The amorphous silicon pattern 110 may be melted by irradiating a laser beam so that the amorphous silicon is changed from a solid state to a liquid state.

The phase change to the liquid state may occur from the upper surface of the amorphous silicon pattern 110 up to the upper surface of the substrate 100 located on the lower surface of the first trench 108. The laser beam may be irradiated at a temperature of about 1,410° C.

Accordingly, single crystals, which constitute the crystalline structure of the substrate 100, act as seeds for the amorphous silicon pattern 110 changed to a liquid state, and as a result, the crystalline structure of the amorphous silicon pattern 110 is changed to single crystals. Also, an excimer laser, which is a type of a gas laser, may be used as a unit for irradiating the laser beam. The laser unit may have a structure capable of scanning in order to irradiate the laser beam within a short period of time.

When irradiating the laser beam, the substrate 100 may be heated. The substrate 100 may be heated in order to reduce temperature inclination in a thin film around a portion where the phase change occurs, when changing the phase of the amorphous silicon pattern 110 by irradiating the laser beam thereto. Accordingly, according to the current embodiment, the substrate 100 may be heated at about 400° C. when irradiating the laser beam.

As described above, by irradiating a laser beam to the amorphous silicon pattern 110 to change the crystalline structure thereof to a single crystal silicon, the preliminary single crystal silicon pattern 112 is formed along the two sidewalls of the first trench 108.

Figure 7:
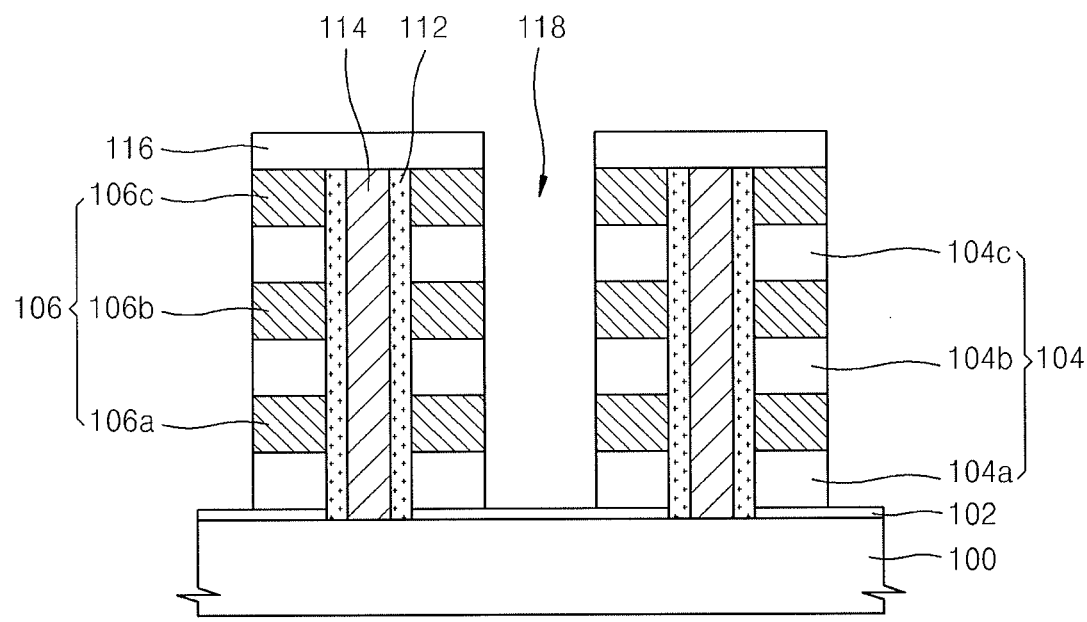
Figure 24:
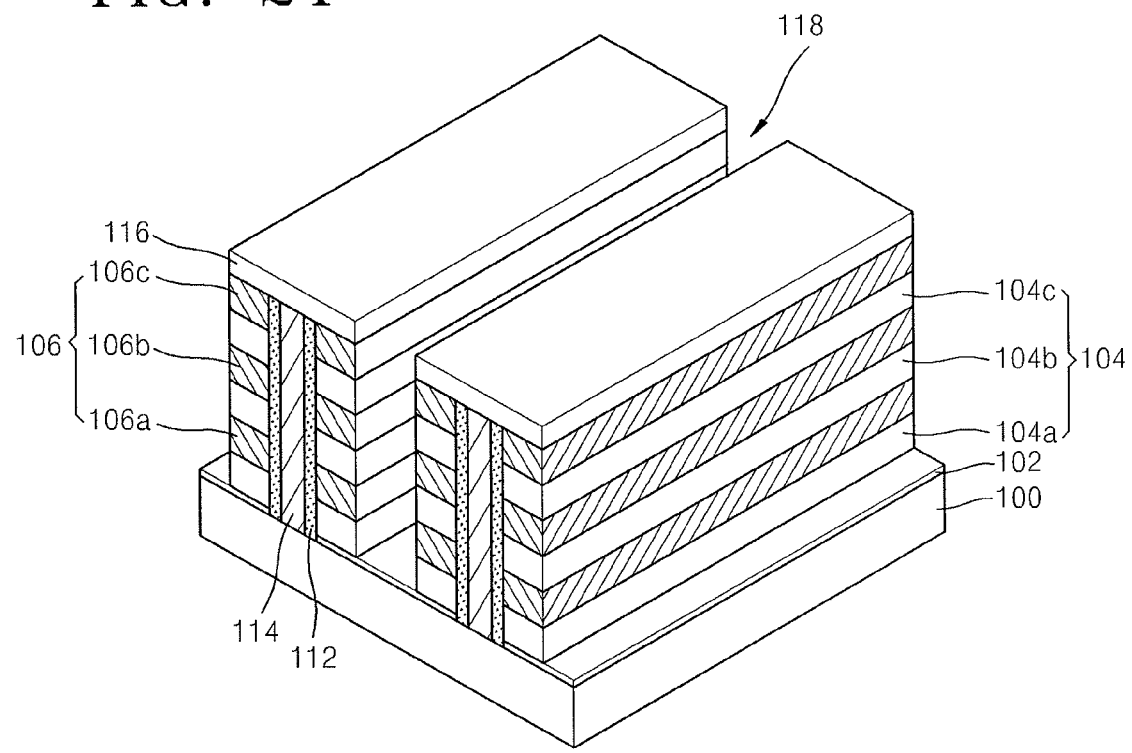

Referring to FIGS. 7 and 24, a portion of an uppermost interlayer insulation layer pattern 106c, the preliminary single crystal silicon pattern 112, and the insulation layer pattern 114 may be polished as desired, thereby planarizing upper surfaces of the uppermost interlayer insulation layer pattern 106c, the preliminary single crystal silicon pattern 112, and the insulation layer pattern 114.

A capping layer 116 may be formed on the uppermost interlayer insulation layer pattern 106c, the insulation layer pattern 114, and the preliminary single crystal silicon pattern 112. The capping layer 116 may be formed by depositing a silicon nitride.

Next, a second trench 118 may be formed between the preliminary single crystal silicon patterns 112 by a photolithography process and an etching process. In detail, the interlayer insulation layer 106 and the sacrificial layers 104 may be sequentially etched to form the second trench 118. The second trench 118 formed using the above process extends in the first direction.

According to another example of the embodiment, the etching process may be carried out such that a surface of the single crystal silicon substrate 100 is not exposed through a lower surface of the second trench 118. This structure may be formed by performing the etching process so that a lowermost sacrificial layer 104a is exposed through the lower surface of the second trench 118.

Figure 8:
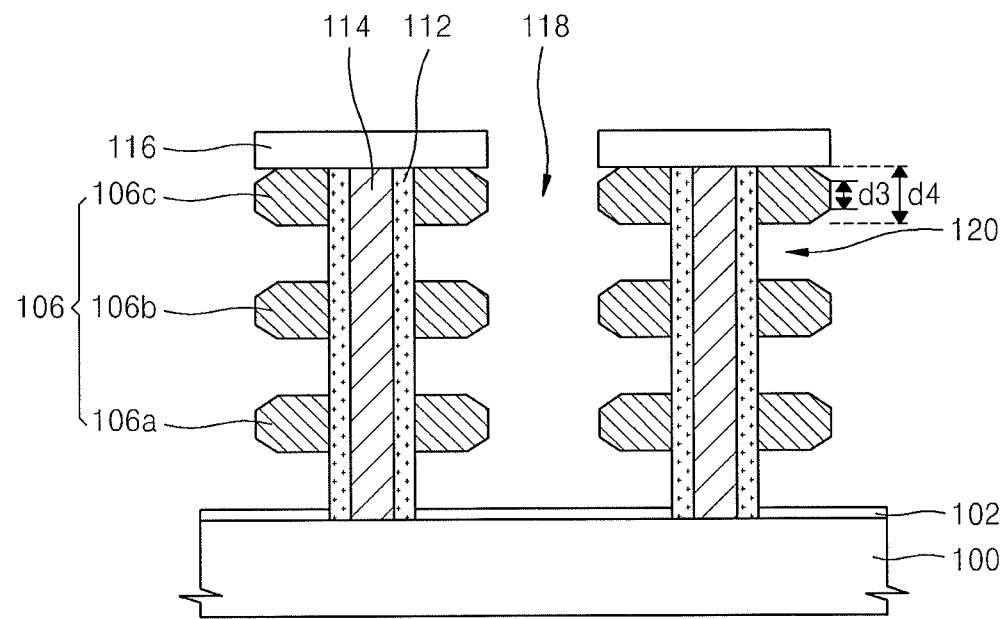
Figure 25:
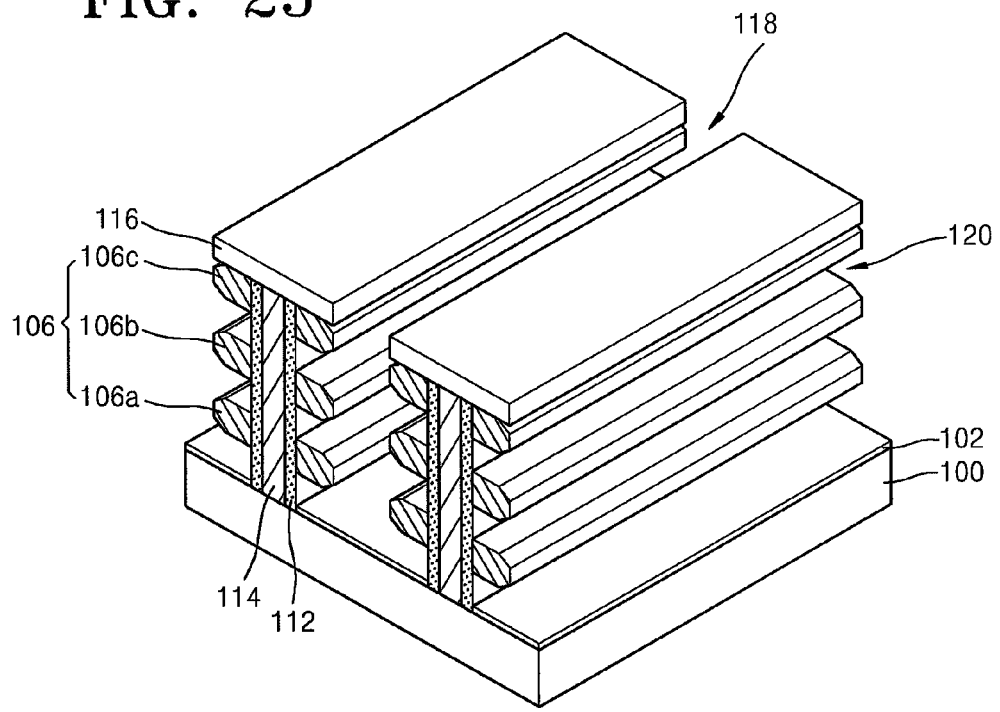

Referring to FIGS. 8 and 25, a first gap 120 connected to the second trench 118 may be formed by removing all of the sacrificial layers 104 of each layer exposed by the second trench 118. Portions of the sidewalls of the preliminary single crystal silicon pattern 112 may be exposed via the first gap 120.

Accordingly, interlayer insulation layer patterns 106 extended in the first direction are left remaining on sidewalls of the preliminary single crystal silicon pattern 112. Also, a first gap 120 is formed between the interlayer insulation layer patterns 106. In a subsequent process, a cell transistor is formed in the first gap 120. The first gap 120 may be extended along the first direction.

Portions of the preliminary single crystal silicon pattern 112 exposed via the first gap 120 may be a channel region. Also, portions of the preliminary single crystal silicon pattern 112 covered by the interlayer insulation layer patterns 106 may be source/drain regions.

Accordingly, after forming the first gap 120, the preliminary single crystal silicon pattern 112 exposed via the first gap 120 may be implanted with p-type impurities to form a channel doping region. To uniformly implant impurities in the exposed sidewalls of the preliminary single crystal silicon pattern 112, the impurities may be implanted by using a plasma doping process. The channel doping region may be doped in order to adjust a threshold voltage of the cell transistor.

However, since a final single crystal silicon pattern is thin, it may be difficult to form the channel doping region. Thus, the impurity doping process for forming the channel doping region may be omitted.

Meanwhile, while removing all of the sacrificial layers 104 exposed via the sidewalls of the second trench 118 using a wet etching process, corner portions of the interlayer insulation layer patterns 106 may be removed.

The interlayer insulation layer patterns 106 may each have a width that continuously or discontinuously decreases away from the single crystal semiconductor patterns 112a that the interlayer insulation layer patterns 106 respectively contact. For example, a width d4 of the interlayer insulation layer patterns 106 near the single crystal semiconductor patterns 112a may be greater than a width d3 of the interlayer insulation layer patterns 106 away from the single crystal semiconductor patterns 112a.

The wet etching process may include removing the sacrificial layer patterns 104 and/or precleaning a tunnel oxide layer 122, which is to be formed later, before deposition, and may be carried out using phosphoric acid and/or fluoric acid.

The interlayer insulation layer patterns 106 illustrated in FIG. 8 may have corners having a polygonal shape, but the shape is not limited thereto. For example, the corners of the interlayer insulation layer patterns 106 may have an oval shape or a streamlined shape.

Figure 9:
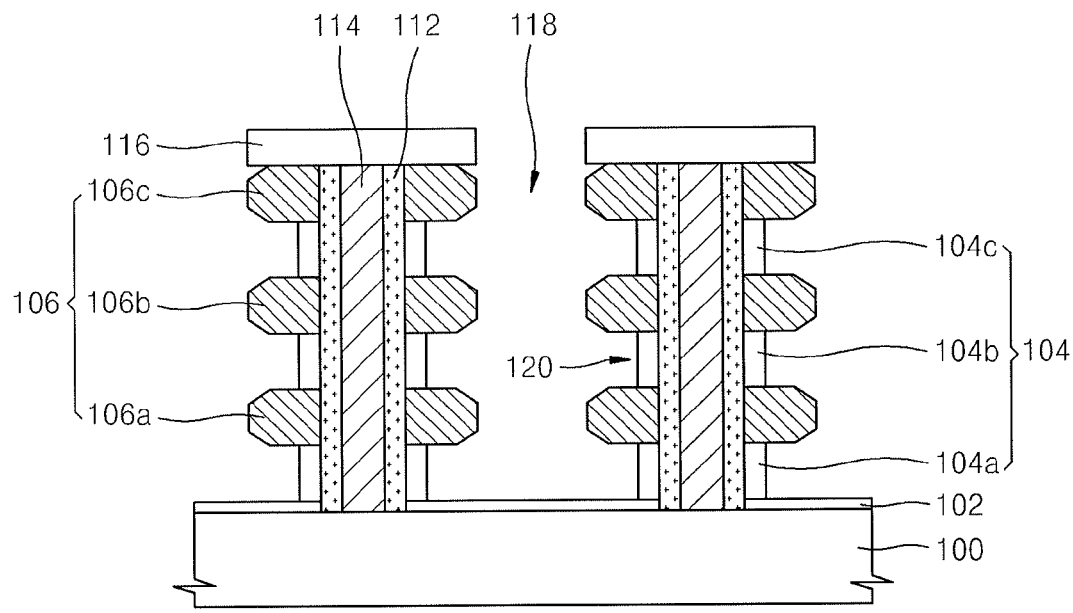

According to an embodiment shown in FIG. 9, a wet etching process may be carried out to remove only portions of the sacrificial layers 104 exposed by the second trench 118, thereby forming a first gap 120 connected to the second trench 118. Since portions of the sacrificial layers 104 remain, the sidewall of the preliminary single crystal silicon pattern 112 is not exposed via the first gap 120. In this respect, the embodiment of FIG. 9 differs from the embodiment of FIG. 8 in which the sacrificial layer 104 is entirely removed and the sidewall of the preliminary single crystal silicon pattern 112 is exposed.

While removing the sacrificial layers 104 exposed by the second trench 118, portions of the corner portions of the interlayer insulation layer patterns 106 may be removed. The wet etching process may include an operation of removing a portion of the sacrificial layer patterns 104, and may be an operation using phosphoric acid and/or fluoric acid.

The interlayer insulation layer patterns 106 illustrated in FIG. 9 may have corners having a polygonal shape, but the shape is not limited thereto. For example, corners of the interlayer insulation layer patterns 106 may also have an oval shape or a streamlined shape under the conditions of the wet etching process.

After removing portions of the corners of the interlayer insulation layer patterns 106, all of the remaining sacrificial layer patterns 104 may be removed and a subsequent process may be performed.

While the process illustrated in FIG. 8 is simple, the process illustrated in FIG. 9 may be more advantageous in terms of securing a bridge margin of a metal word line and may also be advantageous in that profiles of patterns may be easily adjusted.

Figure 10:
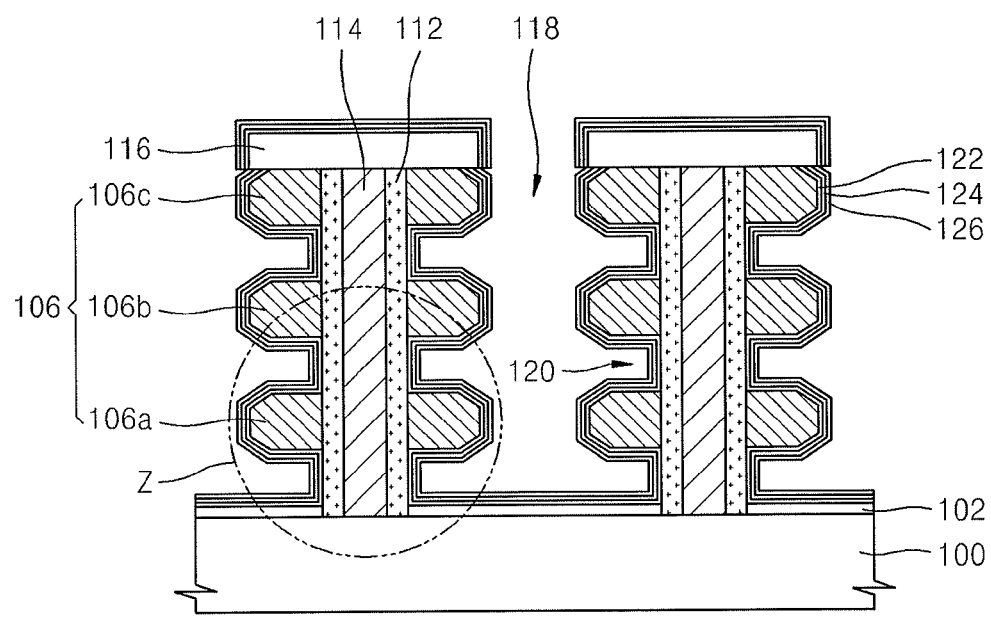

Referring to FIGS. 10 and 20, a tunnel oxide layer 122 is formed by thermally oxidizing the exposed preliminary single crystal silicon pattern 112.

The tunnel oxide layer 122 may be formed by using a thermal oxidization process. If the tunnel oxide layer 122 is formed using a thermal oxidization process, durability of the tunnel oxide layer 122 may be increased, and in turn the reliability of cell transistors to be completed may be increased. Alternatively, the tunnel oxide layer 122 may be formed using a CVD method.

When a thermal oxidization process is performed as described above, the tunnel oxide layer 122 may be formed on the exposed surface of the preliminary single crystal silicon patterns 112. Also, the tunnel oxide layer 122, having a relatively thin thickness, may be formed on surfaces of the interlayer insulation layer pattern 106 and the capping layer 116. Thus, the tunnel oxide layer 122 may be formed along the surfaces of the preliminary single crystal silicon pattern 112, the interlayer insulation layer pattern 106, and the capping layer 116.

According to another embodiment, by adjusting the condition of the thermal oxidization process, a tunnel oxide layer 122 may be formed only on the surface of the preliminary single crystal silicon pattern 112 and not on the surfaces of the interlayer insulation layer pattern 106 and the capping layer 116, which are formed of silicon oxide. In this case, the tunnel oxide layer 122 is separated into different layers.

Next, a charge storage layer 124 is formed along a surface of the tunnel oxide layer 122. The charge storage layer 124 may be formed using a CVD method. The charge storage layer 124 may be formed by depositing a silicon nitride or a metal oxide. The silicon nitride and the metal oxide may be insulation materials. Accordingly, the cell transistors are not electrically short-circuited even when they are connected to one another.

Next, a blocking dielectric layer 126 is formed on a surface of the charge storage layer 124. The blocking dielectric layer 126 may be formed by depositing a silicon nitride or a metal oxide.

Figure 11:
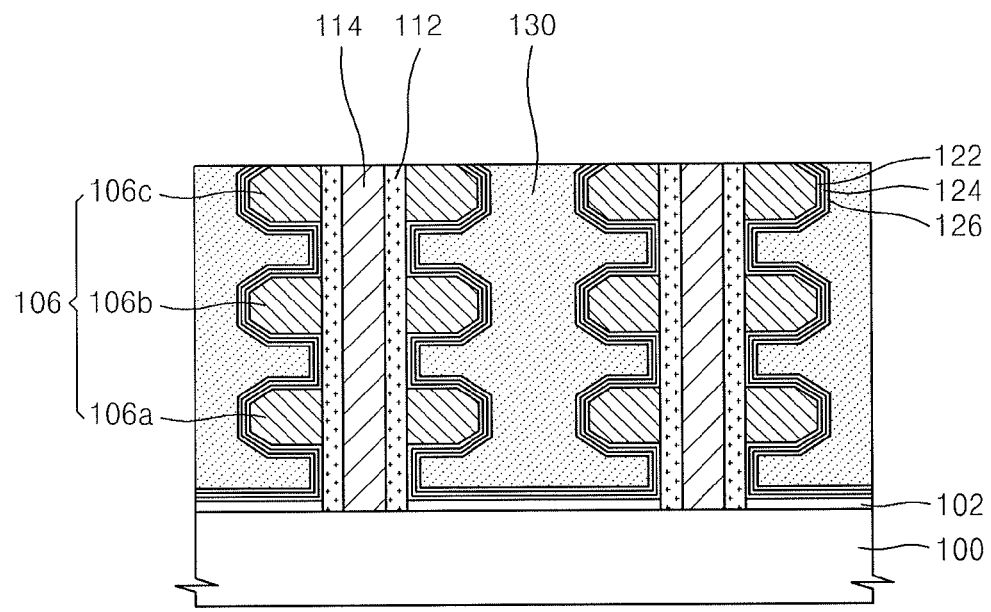

Referring to FIG. 11, a conductive layer (not shown) may be deposited on the blocking dielectric layer 126 so as to completely fill in the second trench 118 and the first gap 120. According to another example of the embodiment, a conductive layer (not shown) may be deposited on the blocking dielectric layer 126 so as to completely fill in the first gap 120 only. A portion of the conductive layer is formed to a control gate pattern in a subsequent process.

In order to fill the second trench 118 and the first gap 120 with a conductive material without any void, a material having good step coverage characteristics may be used as the conductive layer. For example, the conductive layer may be formed by depositing impurity-doped polysilicon or by depositing tungsten.

After forming the conductive layer, the conductive layer may be polished so as to expose an upper surface of the uppermost interlayer insulation layer 106c, thereby forming a conductive layer pattern 130 in the second trench 118 and the first gap 120. In the above polishing process, the capping layer 116 may be completely removed. Also, the tunnel oxide layer 122, the charge storage layer 124, and the blocking dielectric layer 126 formed on the capping layer 116 may also be removed.

According to another embodiment, although not shown in the drawing, the polishing process may be performed so as to expose the capping layer 116 to thereby leave the capping layer 116. When the capping layer 116 is left as described above, the capping layer 116 may be used as a hard mask pattern later when performing an anisotropic etching process on the conductive layer pattern 130. In this case, a thickness of the capping layer 116 may be formed to be sufficiently thick to be used as a hard mask pattern.

As described above, according to the current embodiment, a gate replacement process of filling the first gap 120, which defines a region in which a floating gate pattern is to be formed, with a conductive material maybe performed to form a floating gate pattern. Thus, contrary to an operation of forming the floating gate pattern using a typical photolithography etching process, no attack is applied to boundaries of the tunnel oxide layer 122 when forming the floating gate pattern. In addition, after forming the floating gate pattern, a damage curing process such as re-oxidation is not necessary. Thus, a defect known as a "bird's beak" is not generated on the boundaries of the tunnel oxide layer 122 of each cell transistor.

Figure 12:
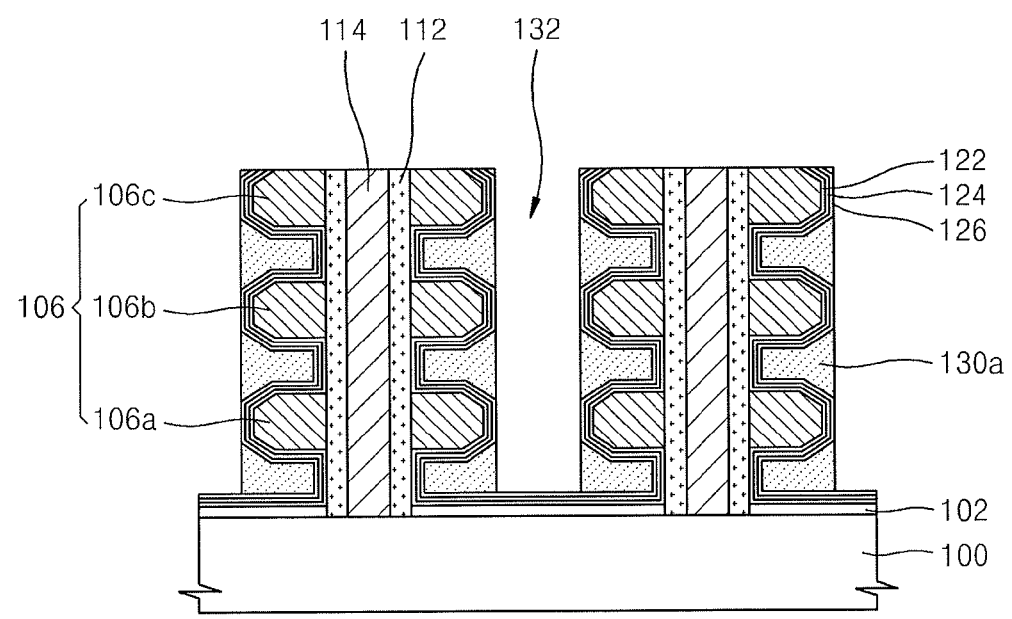
Figure 26:
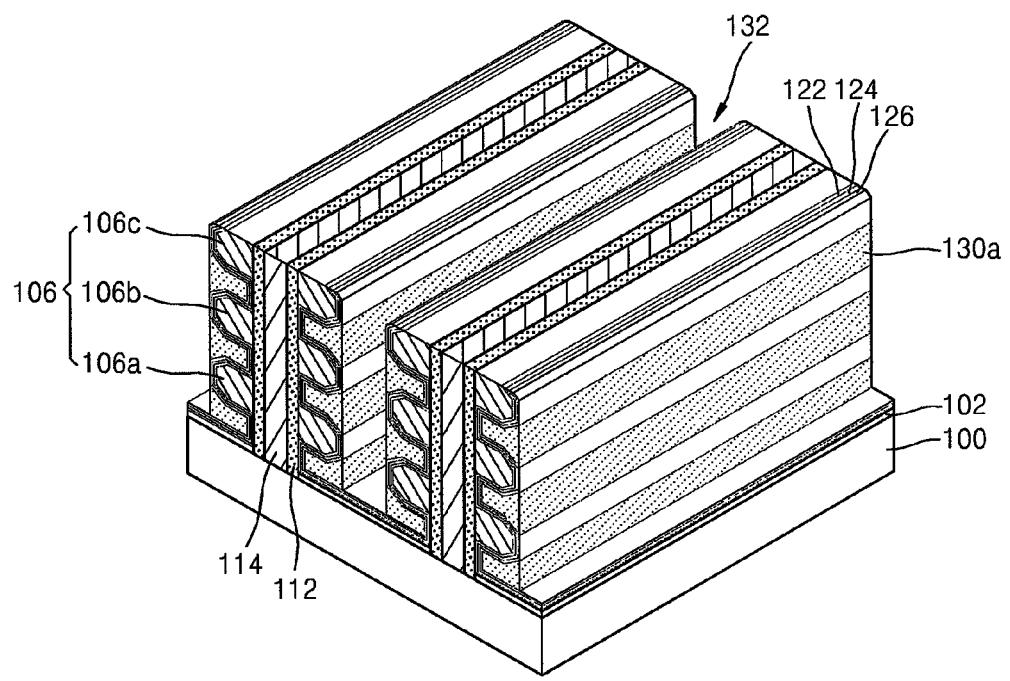

Referring to FIGS. 12 and 26, a third photo resist pattern (not shown) may be formed on the upper surface of the resultant product. The third photo resist pattern selectively exposes an upper surface of the conductive layer pattern 130 formed in the second trench 118. That is, the third photo resist pattern may be formed that exposes a region equal to or greater than the second trench 118.

By anisotropically etching the exposed conductive layer pattern 130 using the third photoresist pattern as an etching mask, a third trench 132 that separates the conductive layer patterns 130 of each of the layers in a vertical direction may be formed. The third trench 132 may have the same form as the second trench 118. Surfaces of the blocking dielectric layer 126, the charge storage layer 124, or the tunnel oxide layer 122 or the surface of the substrate 100 may be exposed via a lower edge of the third trench 132. Alternatively, when preliminary single crystal silicon patterns 112, which have the third trench 132 interposed therebetween, are extended to the surface of the substrate 100 and connected thereto, the surface of the preliminary single crystal silicon patterns 112 may be exposed by the third trench 132.

Accordingly, control gate patterns 130a may be formed between the interlayer insulation layer patterns 106. The control gate patterns 130a may be in contact with a blocking dielectric layer pattern 126a.

The control gate patterns 130a of each of the layers may be in a line form extending in the first direction. That is, none of the control gate patterns 130a of one layer are connected to one another, and the control gate patterns 130a may not surround the preliminary single crystal silicon patterns 112. Also, the control gate patterns 130a of different layers may be insulated from one another.

As illustrated in FIGS. 12 and 26, when forming the third trench 132, the blocking dielectric layer 126, the charge storage layer 124, and the tunnel oxide layer 122 formed originally on the sidewall of the second trench 118 may not be etched. In this case, the tunnel oxide layer 122, the charge storage layer 124, and the blocking dielectric layer 126 within one layer are connected to one another in the first direction. Also, the tunnel oxide layer 122, the charge storage layer 124, and the blocking dielectric layer 126 are connected to one another in a direction perpendicular to the surface of the substrate 100.

Although not shown in the drawing, according to another embodiment, the tunnel oxide layer 122, the blocking dielectric layer 126, and the charge storage layer 124 formed on the sidewall of the second trench 118 may be etched together when forming the third trench 132. In this case, the tunnel oxide layer 122, the charge storage layer 124, and the blocking dielectric layer 126 within one layer are connected to one another in the first direction but are not connected to one another in a direction perpendicular to the surface of the substrate 100.

Figure 13:
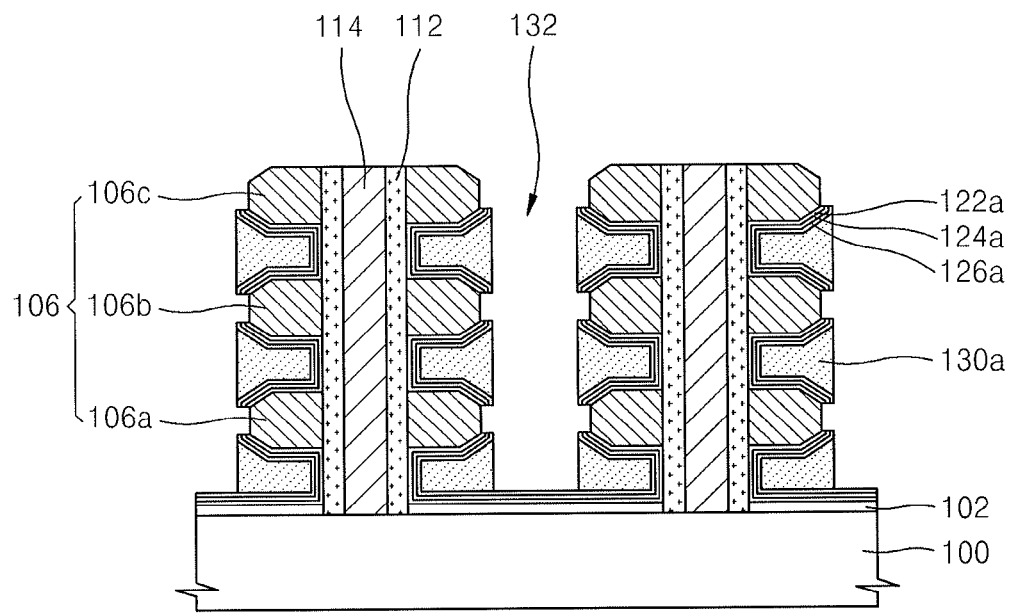
Figure 27:
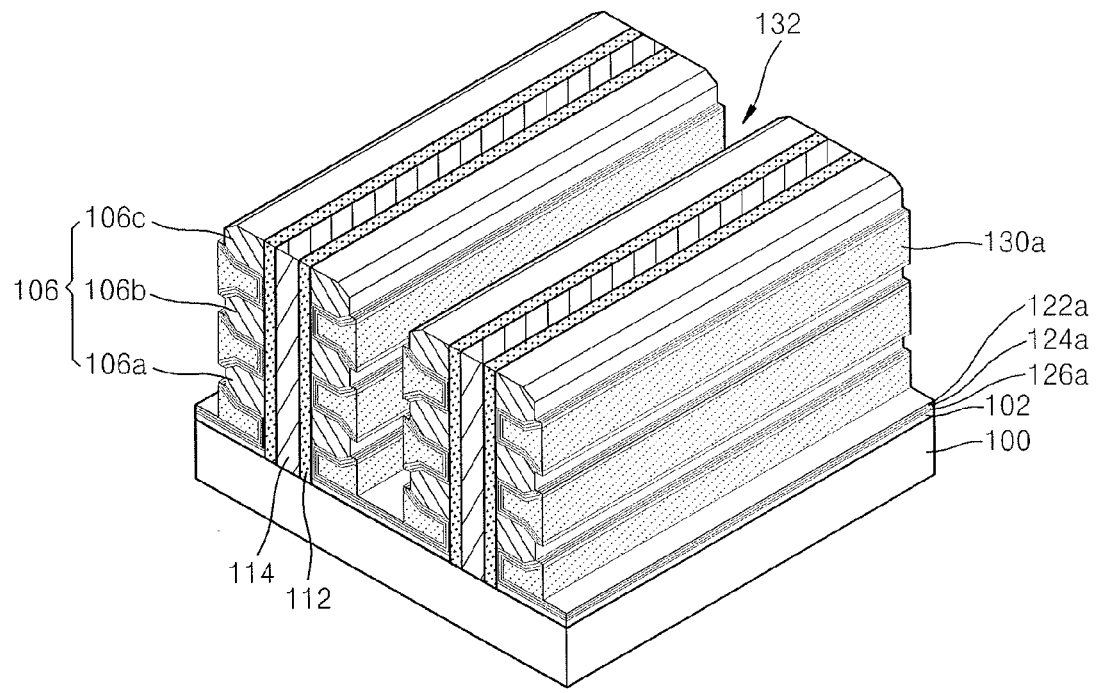

Referring to FIGS. 13 and 27, the blocking dielectric layer 126, the charge storage layer 124, and the tunnel oxide layer 122 exposed via the third trench 132 may be sequentially removed using a wet etching process, thereby exposing sidewalls of the interlayer insulation layer patterns 106 via the third trench 132.

For example, when the blocking dielectric layer 126 includes an aluminum oxide (AlO), a wet etching process using a phosphoric acid may be used to remove the blocking dielectric layer 126 exposed via the third trench 132. When the charge storage layer 124 includes a silicon nitride, a wet etching process using a phosphoric acid may be used to remove the charge storage layer 124 exposed via the third trench 132.

A blocking dielectric layer pattern 126a, a charge storage layer pattern 124a, and a tunnel oxide layer pattern 122a that remain after the wet etching process are interposed between the preliminary single crystal silicon patterns 112 and the control gate patterns 130a. Furthermore, blocking dielectric layer pattern 126a, a charge storage layer pattern 124a, and a tunnel oxide layer pattern 122a may be extended and interposed between the interlayer insulation layer patterns 106 and the control gate patterns 130a according to the conditions of the wet etching process.

Figure 28:
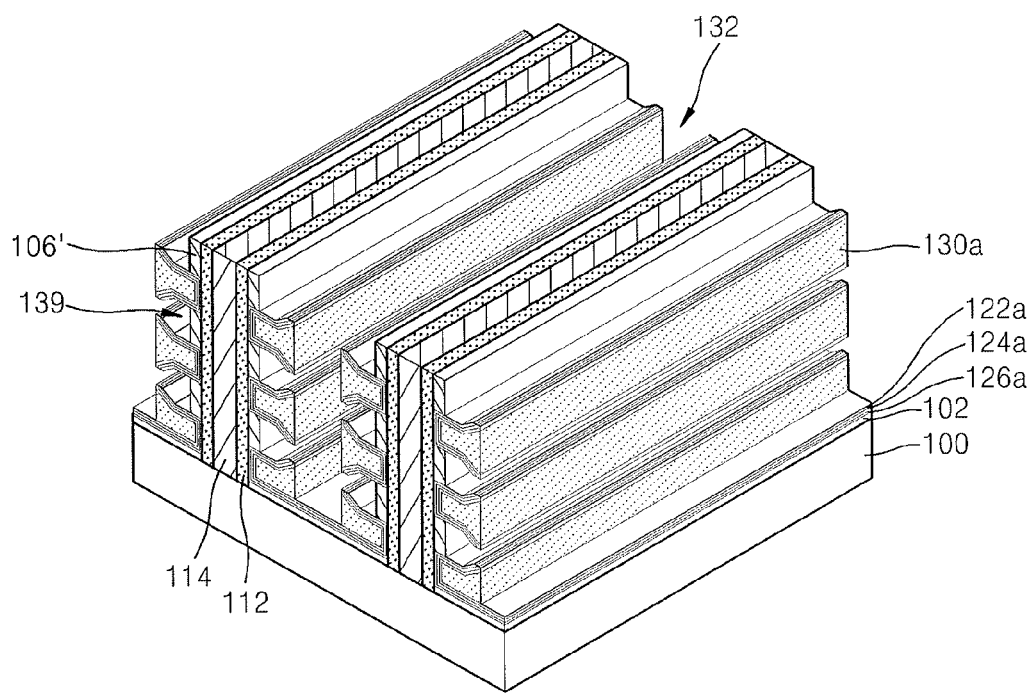

Referring to FIGS. 14 and 28, the interlayer insulation layer patterns 106 may be completely or partially removed using a wet etching process or an isotropic dry etching process to form a second gap 139. Thus, the second gap 139 is empty space, which defines an area defined by the single crystal semiconductor pattern 112a, the tunnel oxide layer pattern 122a, the charge storage layer pattern 124a, and the blocking dielectric layer pattern 126a. When the second gap 139 is formed by completely removing the interlayer insulation layer patterns 106, the second gap 139 directly contacts the single crystal semiconductor pattern 112a. When the second gap 139 is formed by partially removing the interlayer insulation layer patterns 106, the second gap 139 does not directly contact the single crystal semiconductor patterns 112a. Instead, a residual interlayer insulation layer pattern 106' is interposed between the second gap 139 and the single crystal semiconductor patterns 112a.

As described with reference to FIG. 8, since the width d3 of the interlayer insulation layer patterns 106 away from the single crystal semiconductor patterns 112a may be smaller than the width d4 of the interlayer insulation layer patterns 106 near the single crystal semiconductor patterns 112a, a width d1 of the second gap 139 away from the single crystal semiconductor patterns 112a may be smaller than a width d2 of the second gap 139 near the single crystal semiconductor patterns 112a. For example, the second gap d1 may be smaller than 30 nm.

In FIG. 14, an embodiment in which the interposed residual interlayer insulation layer pattern 106' remains is illustrated for convenience. FIGS. 15 through 20 and FIGS. 29 through 31, on the other hand, relate to an embodiment in which the residual interlayer insulation layer pattern 106' is not formed, but instead, the interlayer insulation layer patterns 106 are completely removed to form a second gap 139.

Figure 15:
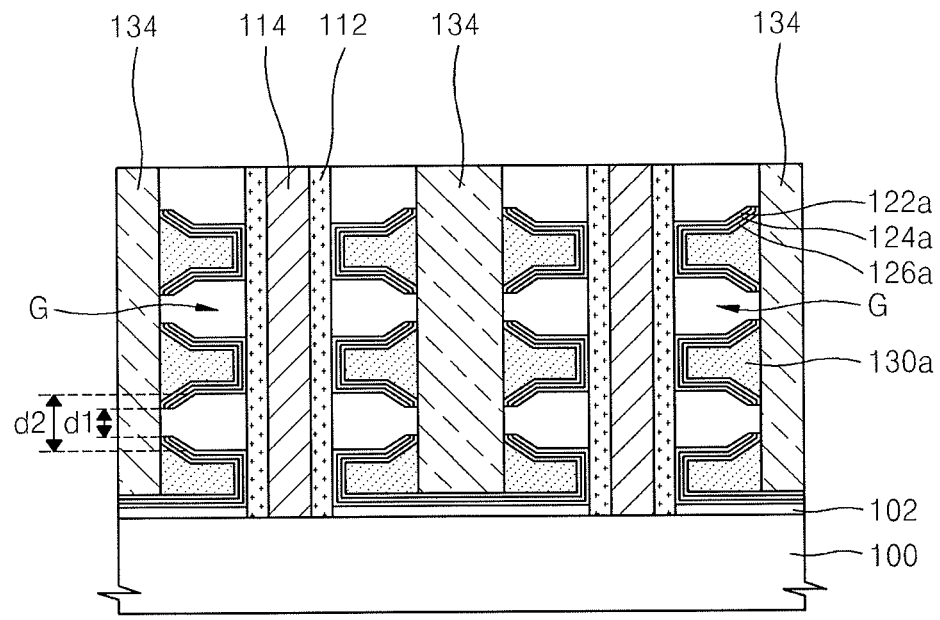
Figure 29:
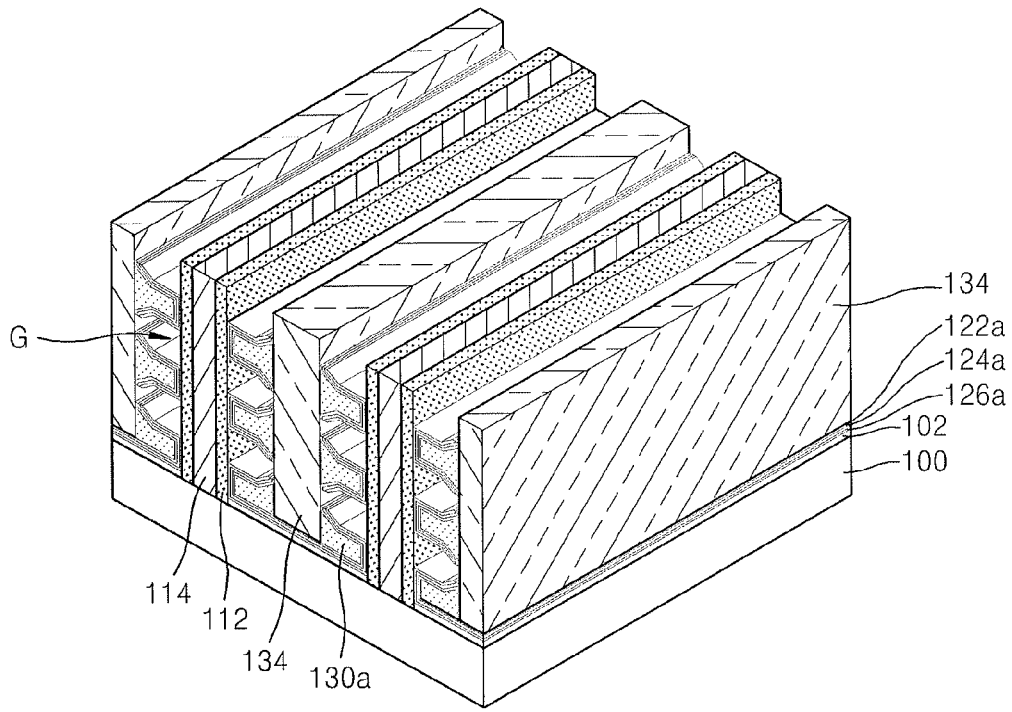

Referring to FIGS. 15 and 29, the third trench 132 is filled with an insulation layer to form an insulation filler layer pattern 134.

The insulation layer may include, for example, a silicon oxide layer. While the insulation layer fills the third trench 132, the second gap 139 is not filled with the insulation layer but remains empty. For example, the second gap 139 cannot be filled with the insulation layer due to the narrow inlet width d1 of the second gap 139. As the insulation filler layer pattern 134 is formed, the second gap 139, which is an open space, forms an interlayer insulation air gap pattern G. Also, as the insulation filler layer pattern 134 is formed, the control gate patterns 130a within one layer are insulated from one another.

Figure 16:
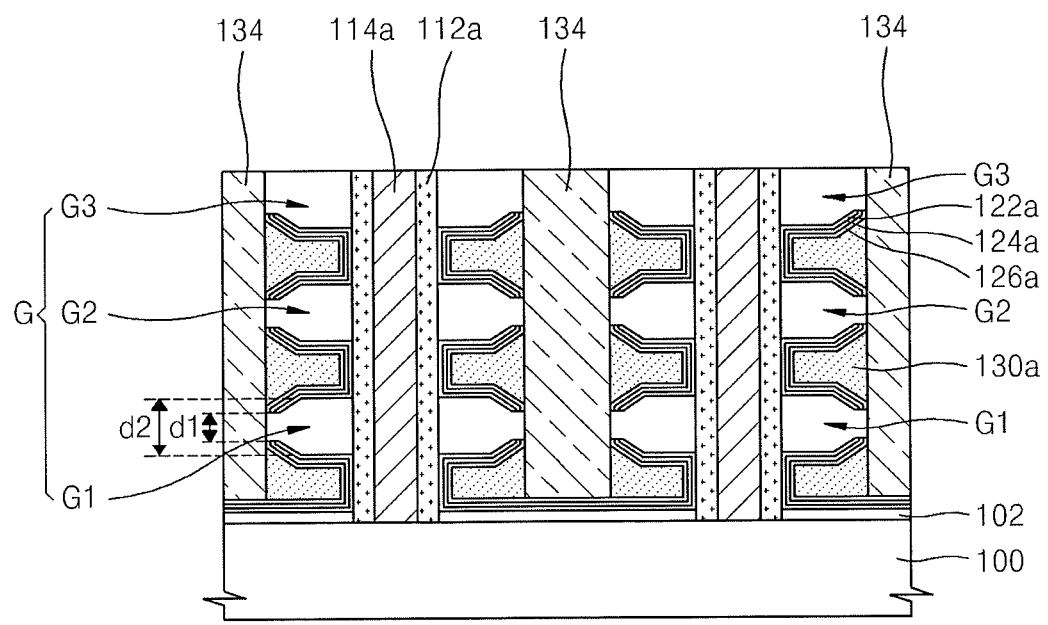
Figure 17:
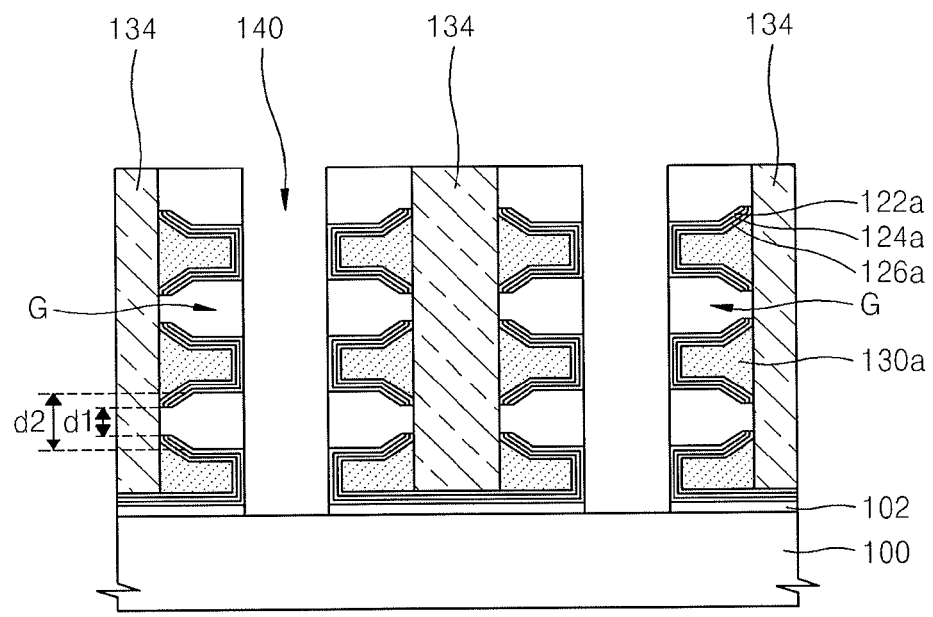
Figure 30:
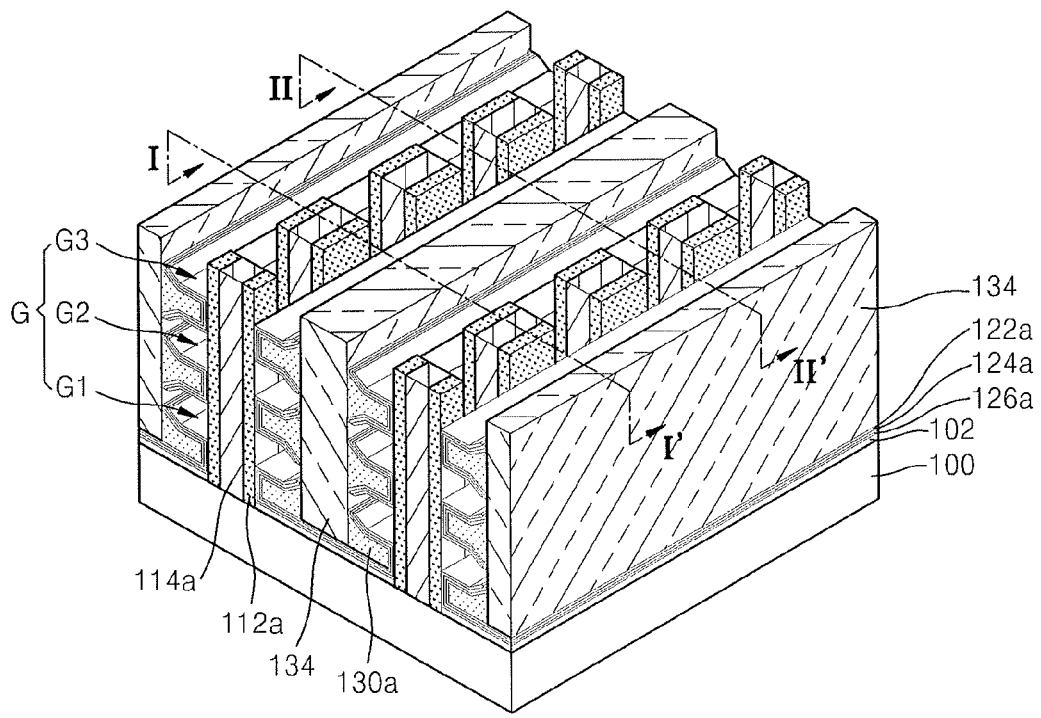

FIG. 16 is a cross-sectional view of the vertical non-volatile memory device of FIG. 30 cut along a line I-I', and FIG. 17 is a cross-sectional view of the vertical non-volatile memory device of FIG. 30 cut along a line II-II'.

Referring to FIGS. 16, 17, and 30, a fourth photoresist pattern (not shown) including a contact-shaped opening formed in an upper surface of the insulation layer pattern 114 may be formed. The fourth photoresist pattern may be formed to expose portions of the preliminary single crystal silicon pattern 112 and the insulation layer pattern 114. The fourth photoresist pattern may be used as an etching mask to etch the insulation layer pattern 114 and the preliminary single crystal silicon pattern 112 so as to expose the surface of the substrate 100. As a portion of the preliminary single crystal silicon pattern 112 is removed using the above process, isolated, single crystal semiconductor patterns 112a may be formed on two sidewalls of the insulation layer pattern 114. The single crystal semiconductor patterns 112a may be pillar-shaped. The single crystal semiconductor patterns 112a may be formed by anisotropically etching a portion of the bar-type preliminary single crystal semiconductor pattern 112. Thus, the single crystal semiconductor pattern 112a may have a rectangular shape. Cell transistors may be formed on only one sidewall of the rectangular single crystal semiconductor pattern 112a in a vertical direction.

Figure 18:
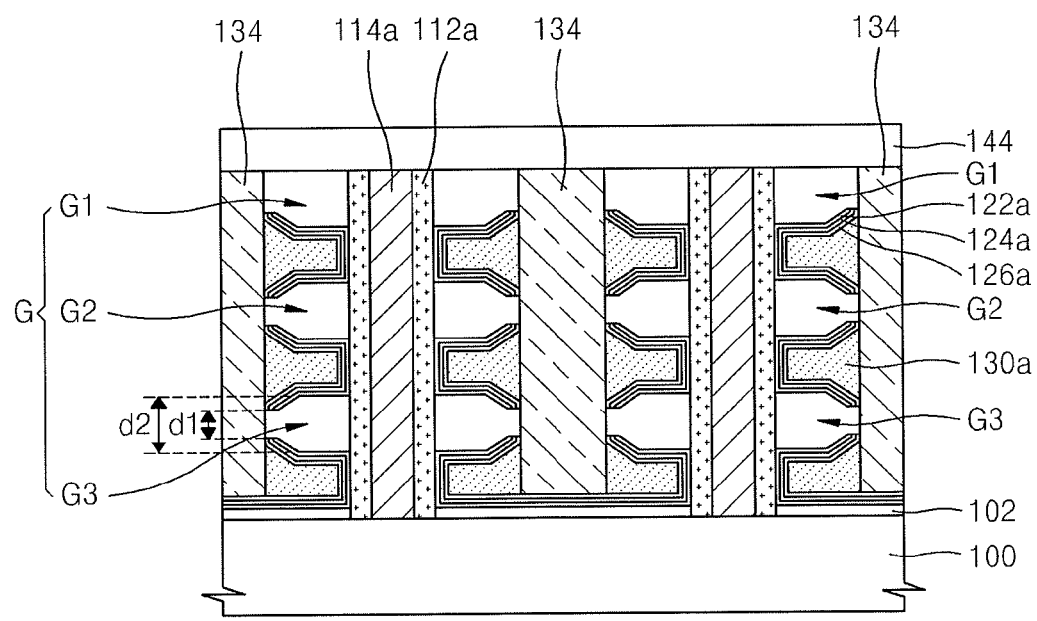
Figure 19:
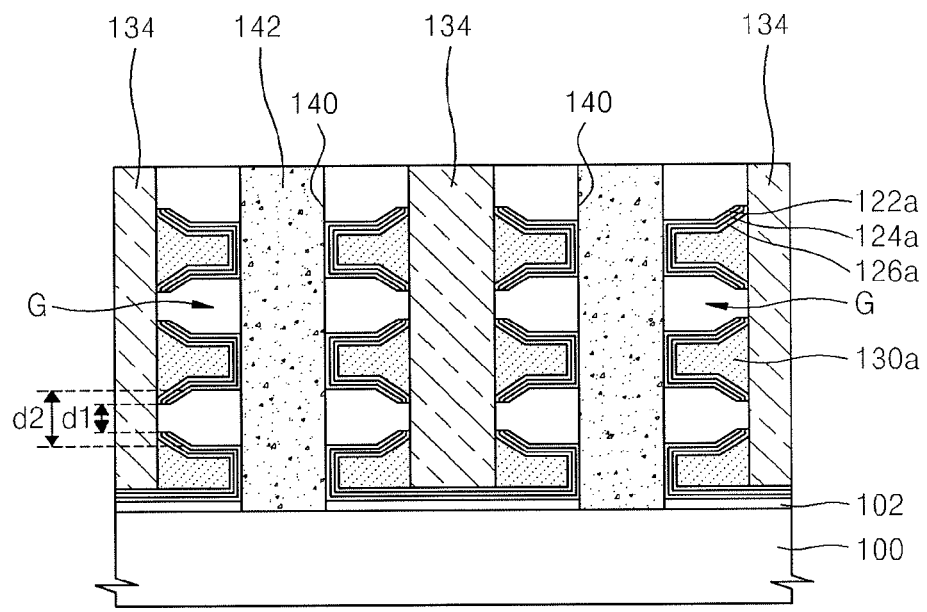
Figure 20:
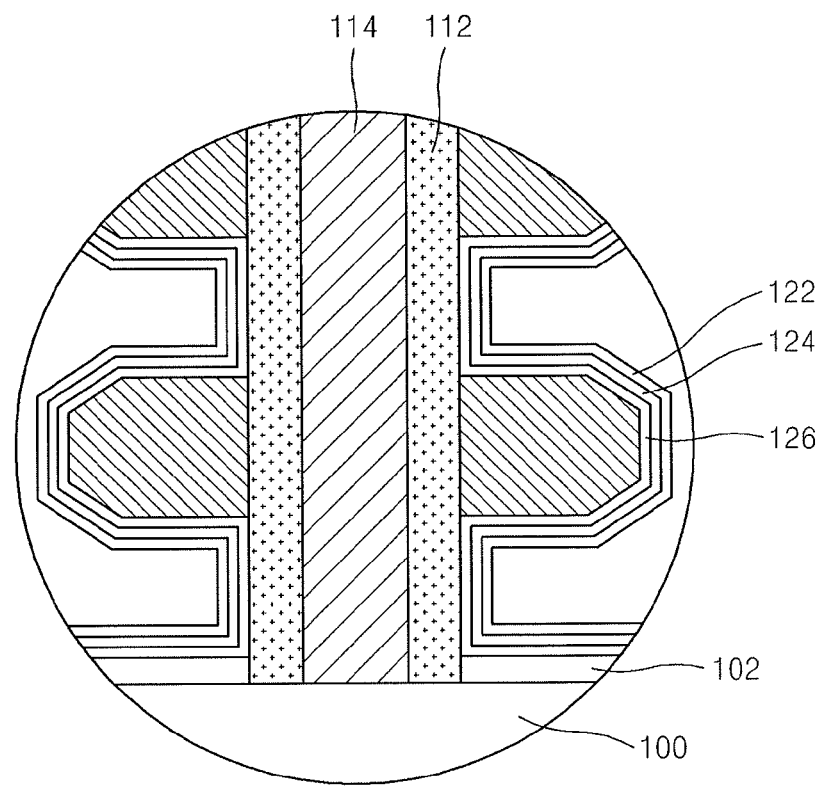
FIG. 20 illustrates an expanded cross-sectional view of a portion of FIG. 10.
Figure 31:
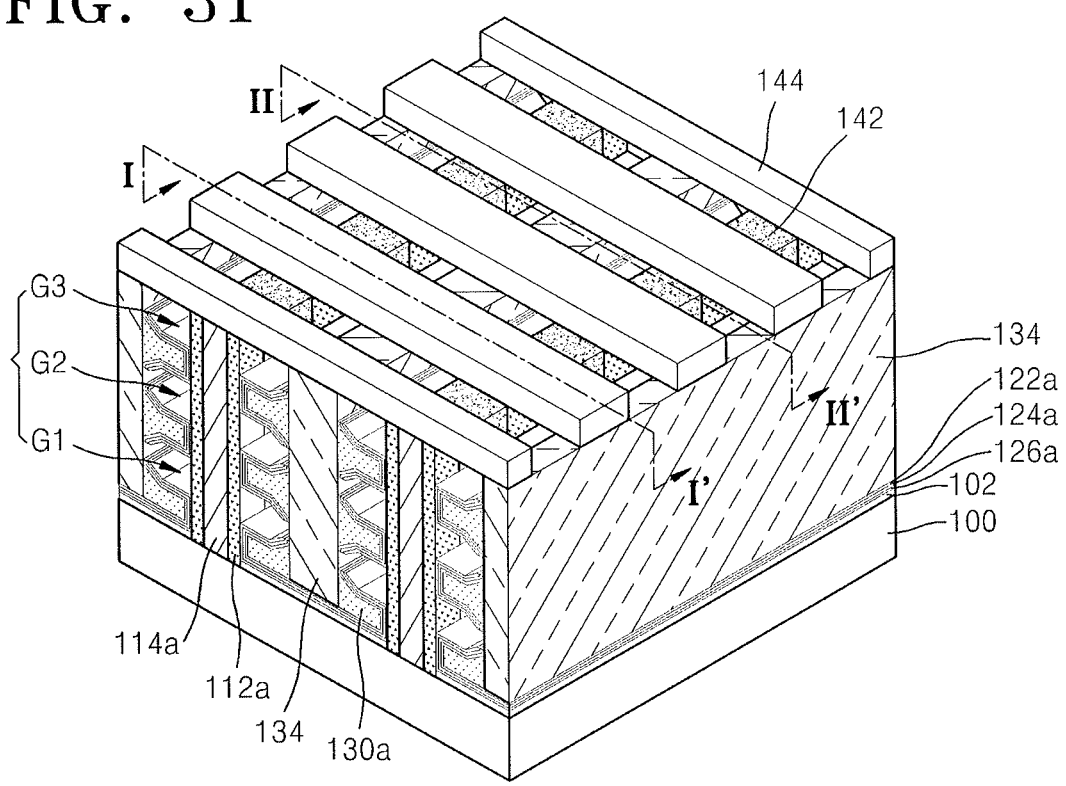

FIG. 18 is a cross-sectional view of the vertical non-volatile memory device of FIG. 31 cut along a line I-I', and FIG. 19 is a cross-sectional view of the vertical non-volatile memory device of FIG. 31 cut along a line II-II'.

Referring to FIGS. 18, 19, and 31, a silicon oxide layer pattern 142 may be formed so as to fill a fourth trench 140 that is formed by etching a portion of the insulation layer pattern 114 that is exposed by the bit line 144.

While forming the silicon oxide layer pattern 142, interlayer insulation air gap patterns G1 and G2 may not be filled but may remain empty. Filling of the interlayer insulation air gap patterns G1 and G2 with the insulation layer may be avoided due to a narrow inlet width of the interlayer insulation air gap patterns G1 and G2. According to circumstances, an interlayer insulation air gap pattern G3, which is an uppermost layer, may be filled with the silicon oxide layer pattern 142.

Next, a bit line 144 may be formed on the exposed single crystal semiconductor patterns 112a, to connect the single crystal semiconductor patterns 112a that are repeatedly formed in the first direction.

As described above, there is no need to form a separate bit contact plug before forming the bit line 144. Accordingly, an operation of forming a bit line is simplified.

According to another embodiment, although not shown in the drawing, contact plugs connecting the single crystal semiconductor patterns 112a may be formed, and a bit line connecting the contact plugs to one another may be formed.

Accordingly, a NAND type non-volatile memory device including vertically and serially connected cell transistors is completed. According to the methods of the embodiments, single crystal semiconductor patterns are formed using a silicon layer deposited on two sidewalls of a trench, and thus the single crystal semiconductor patterns have a very small width. Accordingly, the number of single crystal semiconductor patterns formed within a small horizontal surface area may be increased, which in turn increases the integration degree of the NAND type non-volatile memory device.

Compared to embodiments in which interlayer insulation layer patterns that may generate impurities are interposed between the control gate patterns 130a, a semiconductor device according to the present embodiments, having the interlayer insulation air gap patterns G are interposed between the control gate patterns 130a, may not be affected by such impurities In detail, the semiconductor device is not affected by hydrogen atoms contained in the interlayer insulation layer pattern, since such an interlayer insulation layer pattern is omitted and is replaced by the interlayer insulation air gap patterns G. Accordingly, an improvement of the performance of the semiconductor device is facilitated.

By replacing the interlayer insulation layer patterns with the interlayer insulation air gap patterns G, a height of the vertical non-volatile memory device may be reduced, and a deep etching operation of an etching process may be saved.

Figure 32:
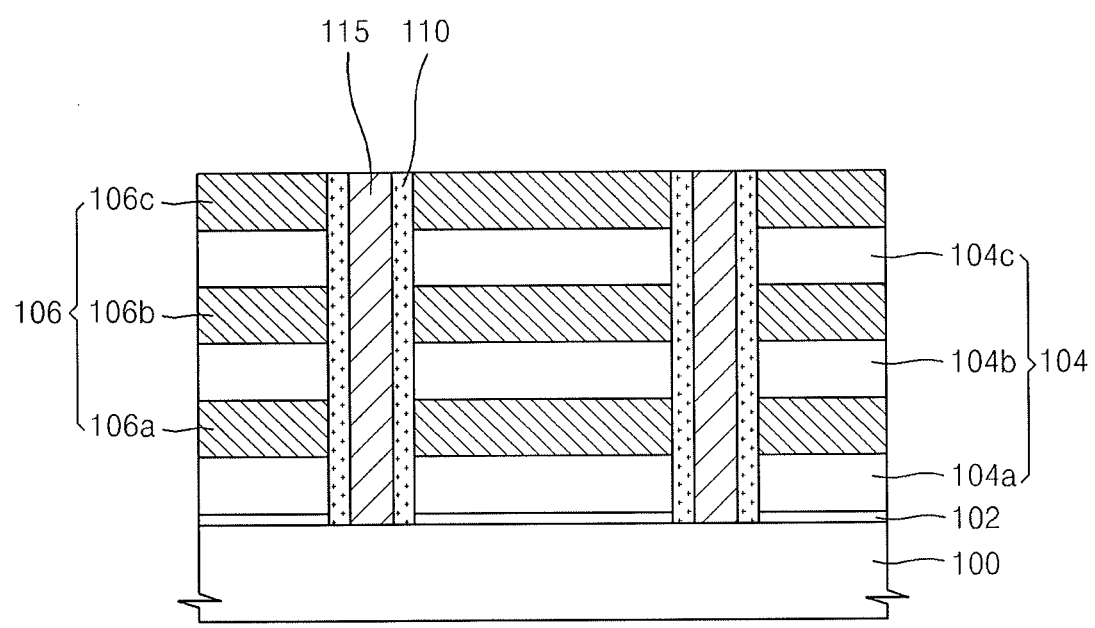
FIGS. 32 through 34 illustrate cross-sectional views of a method of manufacturing a vertical non-volatile memory device according to another embodiment.
Figure 33:
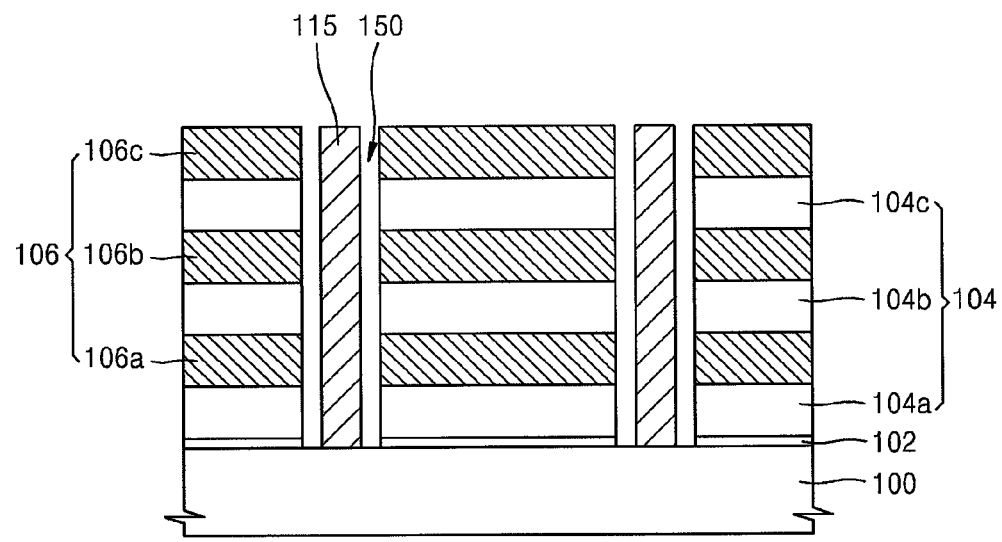
Figure 34:
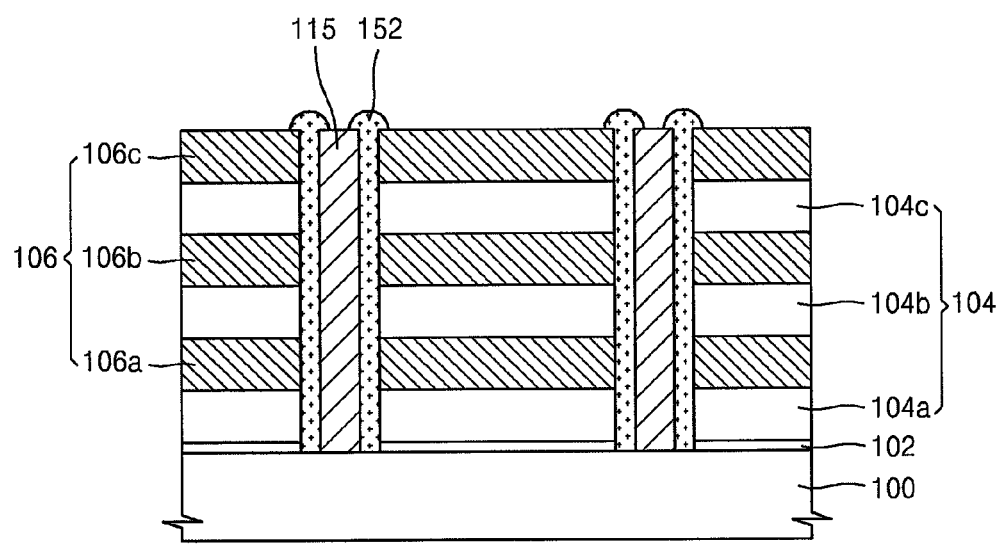

FIGS. 32 through 34 are cross-sectional views illustrating a method of manufacturing a vertical non-volatile memory device according to another embodiment.

Referring to FIG. 32, first, operations as described with reference to FIGS. 3 through 5 may be performed to form an insulation layer structure including a first trench 108 and an amorphous silicon pattern 110 formed on two sidewalls of the first trench 108, on a substrate 100. Instead of the amorphous silicon pattern 110, a polysilicon pattern may be formed on the two sidewalls of the first trench 108. The amorphous silicon pattern 110 or a polysilicon pattern is removed later and is provided as a sacrificial layer for forming minute trenches.

Next, a silicon oxide layer (not shown) is formed to fill the first trench 108 in which the amorphous silicon pattern 110 is formed. After forming the silicon oxide layer, the silicon oxide layer is polished such that an upper surface of the amorphous silicon pattern 110 is exposed, thereby forming an insulation layer pattern 115.

Referring to FIG. 33, by removing the exposed amorphous silicon pattern 110, minute trenches 150 are formed between the insulation layer pattern 115 and the insulation layer structure. The substrate 100 may be exposed by the minute trenches 150.

The amorphous silicon pattern 110 may be removed using a wet etching process or a dry etching process. For example, in order to reduce damage of a surface of the substrate 100 and to completely remove the amorphous silicon pattern 110, the amorphous silicon pattern 110 may be removed using a wet etching process.

The minute trenches 150 define a region in which a preliminary single crystal silicon pattern is to be formed. Thus, by adjusting a thickness of the amorphous silicon pattern 110, a width of the preliminary single crystal silicon pattern may be adjusted.

Referring to FIG. 34, a selective epitaxial growth process in which the surface of the substrate 100 exposed through the lower surface of the minute trenches 150 is used as a seed, is performed to form a single crystal silicon layer 152 that completely fills in the minute trenches 150.

Next, the single crystal silicon layer 152 is polished so as to expose a surface of an uppermost interlayer insulation layer 106 to form a preliminary single crystal silicon pattern 112 as illustrated in FIG. 6.

After forming the preliminary single crystal silicon pattern 112, operations as illustrated in FIGS. 7 through 19 are performed to complete a non-volatile memory device.

Figure 35:
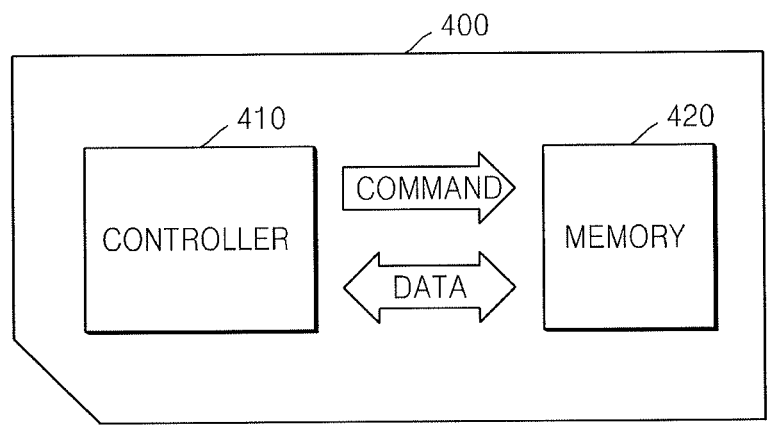
FIG. 35 illustrates a schematic view of a memory card including a non-volatile memory device according to an embodiment.

FIG. 35 is a schematic view illustrating a memory card 400 including a non-volatile memory device according to an embodiment.

The memory card 400 may be arranged such that a controller 410 and a memory 420 exchange electrical signals. For example, upon a command by the controller 410, the memory 420 may transmit data.

The memory 420 may include a vertical non-volatile memory device according to the embodiments.

Examples of the memory card 400 include a memory stick card, a smart media card (SM), a secure digital card (SD), a mini-secure digital card (mini SD), and a multimedia card (MMC).

Figure 36:
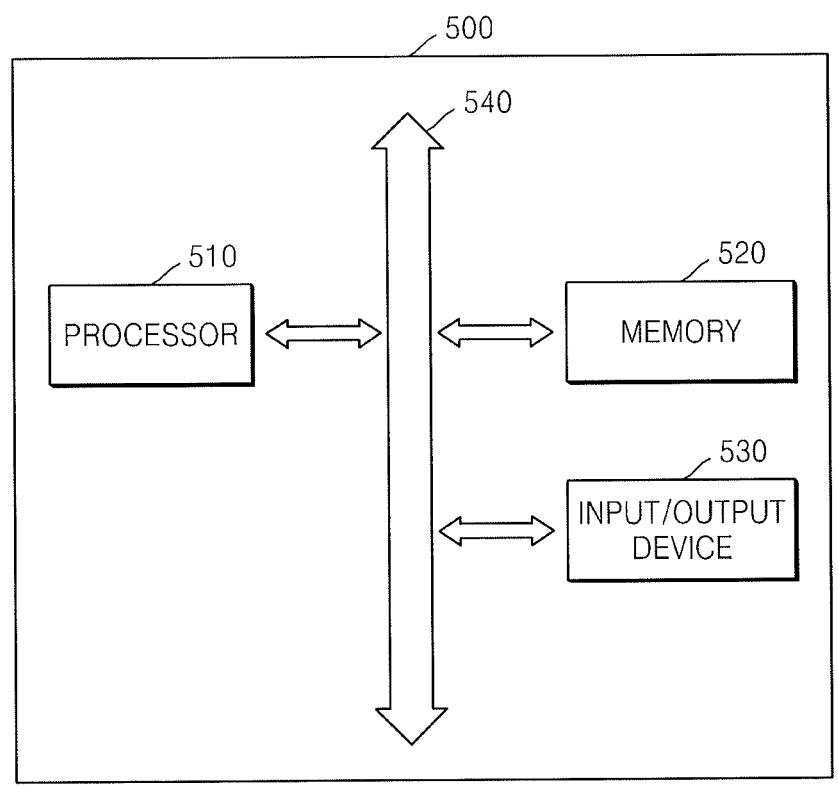
FIG. 36 illustrates a schematic view of a system including a semiconductor device according to an embodiment.

FIG. 36 is a schematic view illustrating a system 500 including a semiconductor device according to the embodiment.

In the system 500, a processor 510, an input/output device 530, and a memory 520 may communicate with one another via a bus 550.

Examples of the memory 520 of the system 500 include a random access memory (RAM) and a read only memory (ROM). The system 500 may also include a peripheral device 540 such as a floppy disk drive and a compact disk (CD) ROM drive.

The memory 520 may include the vertical non-volatile memory devices according to the embodiments. The memory 520 may store codes and data for operating the processor 510. The system 500 may be applied to a mobile phone, an MP3 player, a navigation device, a portable multimedia player (PMP), a solid state disk (SSD), or household appliances.

By way of summation and review, it is desirable for flash memory devices to be designed with the capability of storing high capacity data. Accordingly, it is desirable to increase the number of cell transistors formed in a unit chip. However, it may difficult to highly integrate cell transistors within a horizontal surface area of a limited substrate. Embodiments describe herein may provide a high-performance highly integrated vertical non-volatile memory device and a method of manufacturing the vertical non-volatile memory device Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A vertical non-volatile memory device comprising:
a semiconductor pattern on a substrate; and
a plurality of transistors of a first through n-th layers that are stacked on a side of the semiconductor pattern at predetermined distances in multiple layers, wherein the plurality of transistors are spaced apart and insulated from one another at the predetermined distances via air gaps, where n is a natural number equal to or greater than 2, and wherein among the air gaps, an air gap has a width that is smaller at a location relatively far from the semiconductor pattern than at a location near the semiconductor pattern.

2. The vertical non-volatile memory device as claimed in claim 1, wherein the plurality of transistors include:
a plurality of tunnel oxide layers, a portion of each tunnel oxide layer contacting a sidewall of the semiconductor pattern, wherein contacting portions are spaced apart at the predetermined distances in a vertical direction;
a plurality of charge storage layers and a plurality of blocking dielectric layers that are sequentially formed on surfaces of the tunnel oxide layers, wherein at least a portion of each charge storage layer and blocking dielectric layer faces the semiconductor pattern; and
a plurality of control gate patterns on surfaces of the blocking dielectric layers and vertically stacked on a surface of the substrate, wherein the control gate patterns face the semiconductor pattern and are spaced apart from one another at the predetermined distances.

3. The vertical non-volatile memory device as claimed in claim 1, wherein the air gaps are interposed between the plurality of transistors of each of the layers.

4. The vertical non-volatile memory device as claimed in claim 1, wherein the width of the air gap at a location relatively far from the semiconductor pattern is smaller than 30 nm.

5. The vertical non-volatile memory device as claimed in claim 1, wherein portions of the semiconductor pattern are directly exposed by the air gaps.

6. The vertical non-volatile memory device as claimed in claim 1, further comprising a residual insulation layer pattern interposed between the air gaps and the semiconductor pattern.

7. The vertical non-volatile memory device as claimed in claim 1, wherein the air gaps are closed spaces.

8. The vertical non-volatile memory device as claimed in claim 1, wherein the semiconductor pattern is a pillar-shaped semiconductor pattern.

9. A vertical non-volatile memory device comprising:
a linear insulation layer pattern on a substrate, the linear insulation layer pattern having two sidewalls;
a plurality of semiconductor patterns contacting the two sidewalls of the insulation layer pattern and formed on a surface of the substrate;
a plurality of tunnel oxide layers, at least a portion of each tunnel oxide layer contacting a corresponding semiconductor pattern at one of the sidewalls to form contacting portions, wherein the contacting portions are spaced apart at predetermined distances in a vertical direction;
a plurality of charge storage layers and a plurality of blocking dielectric layers that are sequentially formed on surfaces of the tunnel oxide layers, wherein at least a portion of the charge storage layers and a portion of the blocking dielectric layers face the semiconductor pattern; and
a plurality of control gate patterns on surfaces of the blocking dielectric layers, each control gate pattern facing the semiconductor pattern, the plurality of control gate patterns being vertically stacked at the predetermined distances in multiple layers, wherein the plurality of control gate patterns are spaced apart from one another by air gaps, each of the air gaps having a width that is smaller at a location relatively far from the semiconductor pattern than at a location near the semiconductor pattern.

10. The vertical non-volatile memory device as claimed in claim 9, wherein the air gaps are interposed between adjacent ones of the control gate patterns and spaced apart at the predetermined distances from one another in multiple layers.

11. The vertical non-volatile memory device as claimed in claim 9, wherein the semiconductor patterns are pillar-shaped.

12. The vertical non-volatile memory device as claimed in claim 9, wherein portions of the semiconductor patterns are directly exposed by the air gaps.

13. The vertical non-volatile memory device as claimed in claim 9, further comprising a residual insulation layer pattern interposed between the air gaps and the semiconductor pattern.

14. A vertical non-volatile memory device comprising:
a plurality of vertical non-volatile memory device units, each unit including:
a linear insulation layer pattern disposed on a substrate, the linear insulation layer pattern having two sidewalls,
a plurality of semiconductor patterns contacting the two sidewalls of the insulation layer pattern and contacting a surface of the substrate,
a plurality of tunnel oxide layers, at least a portion of each tunnel oxide layer contacting the semiconductor patterns at one of the sidewalls to form contacting portions, wherein the contacting portions are spaced apart at predetermined distances in a vertical direction,
a plurality of charge storage layers and a plurality of blocking dielectric layers sequentially formed on surfaces of the tunnel oxide layers, wherein at least a portion of the charge storage layers and a portion of the blocking dielectric layers face the semiconductor pattern, and
a plurality of control gate patterns on surfaces of the blocking dielectric layers, each control gate pattern facing the semiconductor pattern at one of the side walls, the plurality of control gate patterns being vertically stacked at the predetermined distances in multiple layers, wherein the plurality of control gate patterns are spaced apart from one another by air gaps; and
an insulation filler layer between adjacent ones of the plurality of vertical non-volatile memory devices,
wherein:
the adjacent ones of vertical non-volatile memory devices are disposed such that plurality of control gate patterns at respective sides of the adjacent vertical non-volatile memory device face each other, and
the insulation filler layer contacts the plurality of control gate patterns and seals the air gaps.

15. The vertical non-volatile memory device as claimed in claim 14, wherein each air gap has a width that is smaller at a location relatively nearer to the insulation filler layer than at a location relatively nearer to the semiconductor pattern.

* * * * *